United States Patent
Merkel et al.

(10) Patent No.: US 6,680,860 B1
(45) Date of Patent: Jan. 20, 2004

(54) OPTICAL COHERENT TRANSIENT CONTINUOUSLY PROGRAMMED CONTINUOUS PROCESSOR

(75) Inventors: Kristian Merkel, Bozeman, MT (US); William Babbitt, Bozeman, MT (US)

(73) Assignee: Research and Development Institute Inc., Bozeman, MT (US)

( * ) Notice: Subject to any disclaimer, the term of this patent is extended or adjusted under 35 U.S.C. 154(b) by 0 days.

(21) Appl. No.: 09/869,077

(22) PCT Filed: Dec. 22, 1999

(86) PCT No.: PCT/US99/30531

§ 371 (c)(1),
(2), (4) Date: Sep. 24, 2001

(87) PCT Pub. No.: WO00/38193

PCT Pub. Date: Jun. 29, 2000

Related U.S. Application Data

(60) Provisional application No. 60/113,505, filed on Dec. 22, 1998.

(51) Int. Cl.[7] ............................................ G11C 13/04
(52) U.S. Cl. ...................... 365/119; 365/106; 365/215; 365/216; 365/234
(58) Field of Search .......................... 365/215, 216, 365/197, 191, 234, 119, 106; 359/560, 561, 10, 306

(56) References Cited

U.S. PATENT DOCUMENTS 3,896,420 A * 7/1975 Szabo ........................ 365/119
4,459,682 A    7/1984 Mossberg .................... 365/119
5,239,548 A    8/1993 Babbitt et al. ................ 372/26
5,812,318 A    9/1998 Babbitt et al. ............... 359/559

FOREIGN PATENT DOCUMENTS

EP        0700118 A1 *  3/1996  .......... H01Q/19/17

* cited by examiner

Primary Examiner—Andrew Q. Tran
(74) Attorney, Agent, or Firm—McDermott, Will & Emery

(57) ABSTRACT

Techniques for continuously programming a coherent transient spatial-spectral optical signal processor involve the repeated application of two or more spatially distinct optical programming pulses to a non-persistent hole-burning material to write an accumulated, spatial-spectral population grating with low intensity optical pulses as compared to single shot programming. An optical data stream is introduced on a processing beam, resulting in a processor output signal spatially distinct from all the processing pulses. Programming and processing take place simultaneously, asynchronously and continuously. For accumulated gratings, the frequency stability of the optical source is an important consideration. Assuming a sufficiently stable optical source, simulations show that an accumulated (and maintained) grating in steady state, for both storage of a true-time delay and/or pattern waveform, can be highly efficient using currently available materials, on the order of that predicted for a perfect photon-gated device. An experimental demonstration of the continuous programming concept for true time delays programmed with chirped pulses is presented, showing the accumulation of the grating with low area pulses over time until it reaches steady state, for times longer than the persistence of the material.

88 Claims, 20 Drawing Sheets

FIG. 2B
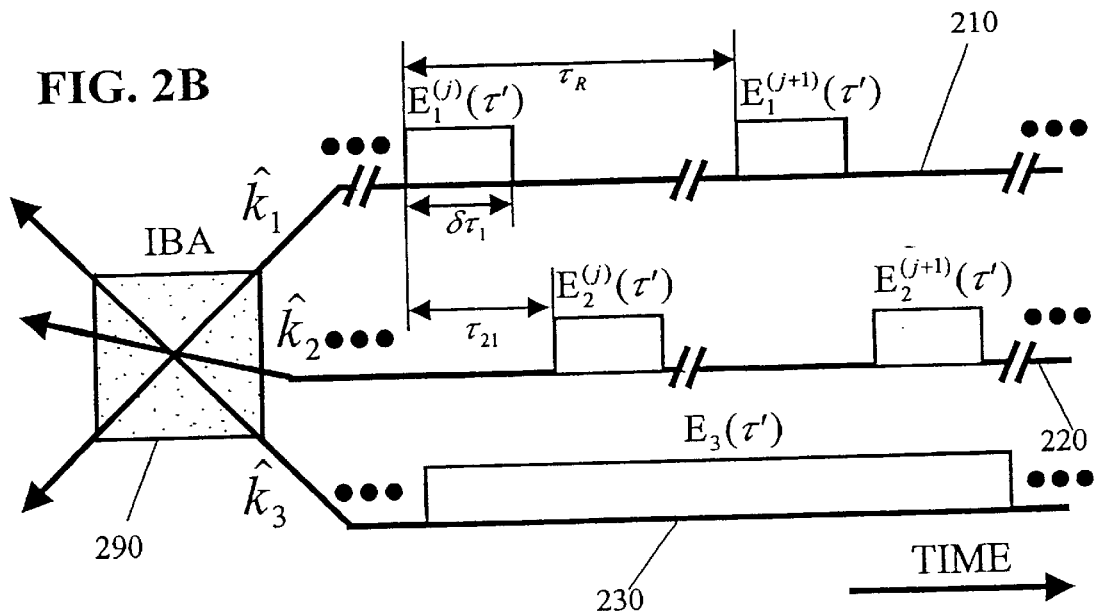
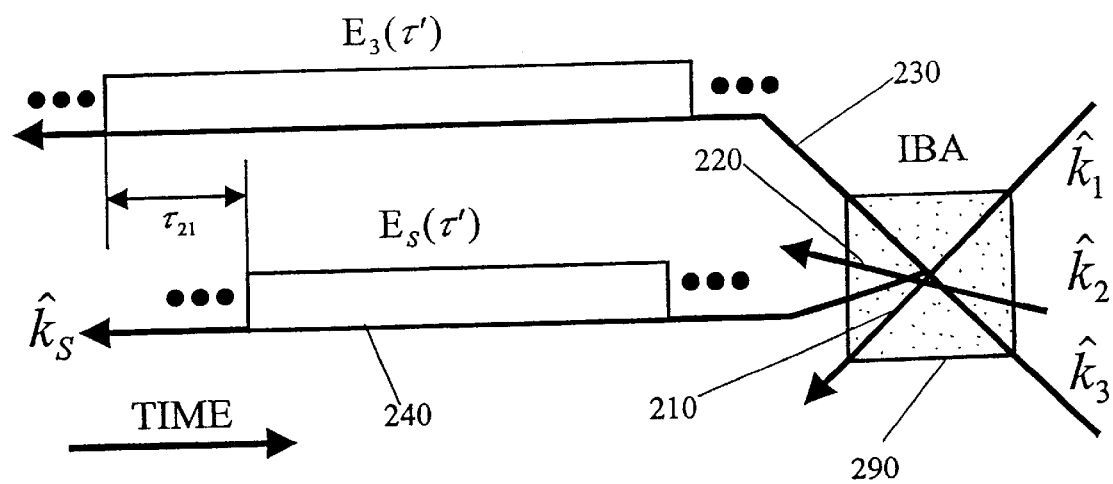
FIG. 2C

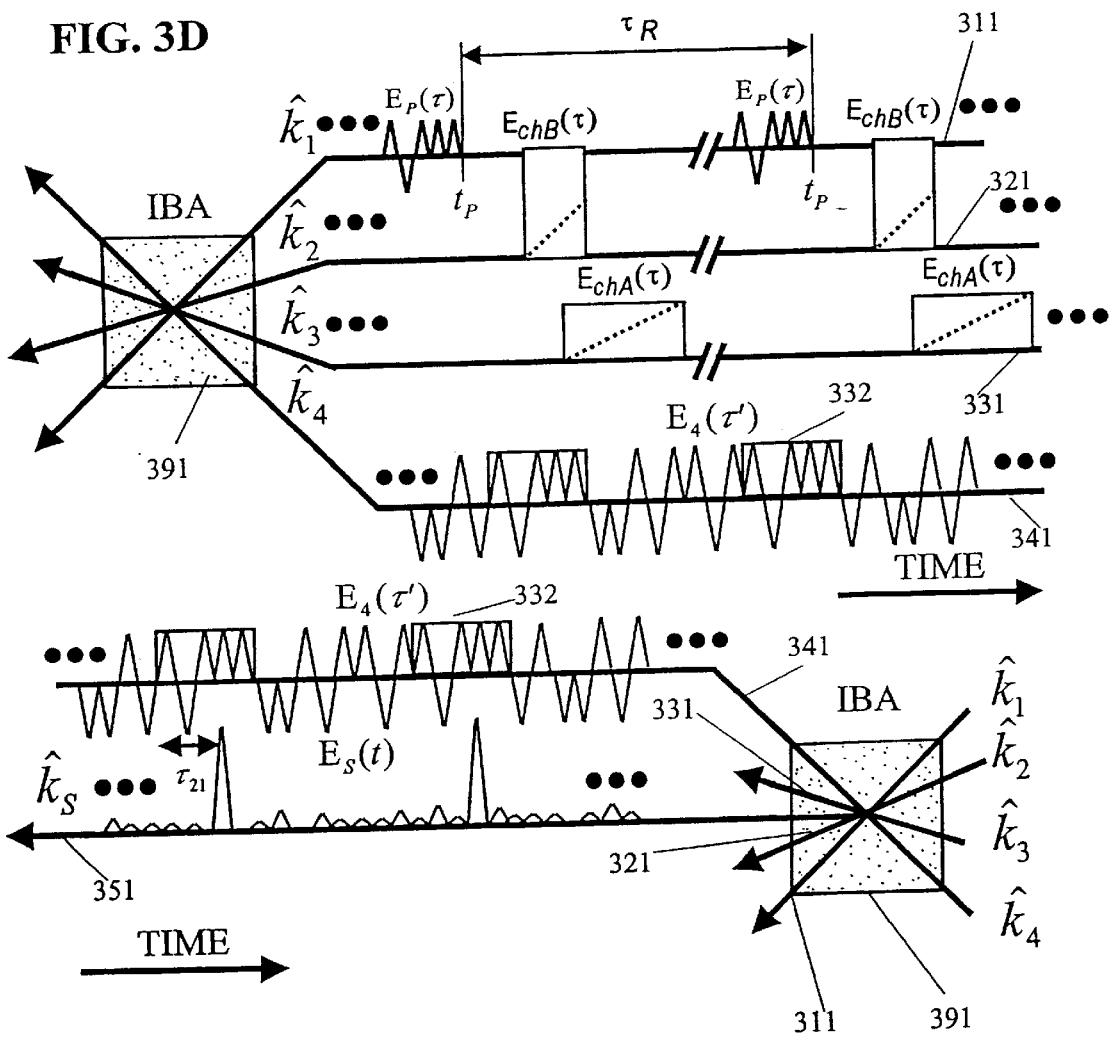

OPTICAL COHERENT TRANSIENT CONTINUOUSLY PROGRAMMED CONTINUOUS PROCESSOR

This application claims the benefit of Provisional Application Ser. No. 60/113,505 filed Dec. 22, 1998.

BACKGROUND

1. Field of the Invention

This invention relates to an electromagnetic coherent transient device and, more particularly, to a continuous processor that can simultaneously, asynchronously, and continuously process an input signal while it is continuously being programmed. The invention has application in, but is not limited to, the areas of memory, correlations/convolutions, true-time delay, pulse shaping, distortion compensation and spatial routing of optical signals.

2. Description of the Related Art

The present invention utilizes several unique properties of condensed phase spectral hole burning materials as versatile coherent transient processors. Absorption features of ions or molecules doped into condensed phase materials are spectrally broadened by two main classes of mechanisms. Homogeneous broadening is the fundamental broadening experienced by all ions or molecules independently, and arises from the quantum-mechanical relationship between the lineshape and the dephasing time of the excited ion. At cryogenic temperatures, such homogeneous linewidths have been measured, using the photon-echo technique, to be as narrow as 100 Hz or less, orders of magnitude sharper than most gas phase transitions (R. W. Equall, Y. Sun, R. L. Cone, R. M. Macfarlane, Ultraslow Optical Dephasing in Eu3+:Y2SiO5, *Phys. Rev. Lett.* 72, 2179 (1994)). Inhomogeneous broadening, such as depicted in FIG. 1A, arises from the overlap of the quasi-continuum of individual spectra of all of the ions or molecules in the condensed phase material, which have microscopically different environments and therefore slightly different transition frequencies. The extent of this envelope can be anywhere from hundreds of megaHertz (MHz) to the teraHertz (THz) range.

Spectral hole burning (W. E. Moerner, ed., Persistent Spectral Hole Burning: Science and Applications, (Springer-Verlag, Berlin 1988); R. M. Macfarlane and R. M. Shelby, "Coherent Transient and Spectral Holebuming Spectroscopy of Rare Earth Ions in Solids," in *Spectroscopy of Solids Containing Rare Earth Ions*, A. A. Kaplyanskii and R. M. Macfarlane, eds. (North Holland, Amsterdam 1987)) uses a narrow-band laser to selectively excite only the small fraction of ions or molecules whose frequencies coincide with that of the laser. If some mechanism exists to remove those ions from the absorbing population, or to change their resonant frequencies, then the inhomogeneous absorption profile can be temporarily or permanently altered, leaving a "spectral hole" or ion population shift at the frequency of the laser. In the cases of interest here, the homogeneous linewidth is many orders of magnitude smaller than the inhomogeneous linewidth. A very flexible advantage of hole burning, in contrast to isolated atomic transitions, is that the center frequency for the hole may be chosen anywhere within the wide inhomogeneous band of absorbing frequencies. Furthermore, multiple holes or ion population variations may be placed within one inhomogeneously broadened absorption band to generate an absorption spectrum. In addition, by varying the intensity of the burning spatially, as with an interference pattern among two or more laser beams, a spatial-spectral grating can be produced.

Mechanisms exist to provide permanent change to preserve the hole; the most common being (a) excitation-induced changes in the lattice near the optically active ion or molecule, (b) photoionization of that ion or molecule itself, and (c) photochemical reactions. Possibilities exist to use photon-gated processes where a second, possibly broadband, light source is required to make the hole persistent.

An electromagnetic wave coherent transient device is one with a broadband spectral grating that extends over several homogeneous profiles, and part or all of the available inhomogeneous broadening absorption profile. An optical coherent transient (OCT) device is one with a broadband spectral grating in the optical range that extends over several homogeneous profiles, and part or all of the available inhomogeneous broadening absorption profile. All the components of an optical spectral grating are typically programmed simultaneously by recording the spectral-spatial interference of two or more optical pulses separated in time and/or space. This spectral grating has the ability to generate an optical output signal that depends on an optical input waveform (referred to as a processing waveform) impinging on that grating, now referred to as a device. Optical coherent transient (OCT) devices have been disclosed such as an optical memory (for example, T. W. Mossberg, "Time-Domain Frequency-Selective Optical Data Storage," *Opt. Lett.* 7, 77 (1982)), a swept carrier optical memory (for example, T. W. Mossberg, "Swept-Carrier Time-Domain Optical Memory," *Opt. Lett.* 17, 535 (1992)), an optical signal cross-correlator (for example, W. R. Babbitt and J. A. Bell, "Coherent Transient Continuous Optical Processor," *Appl. Opt.* 33, 1538 (1994)), an optical true-time delay regenerator (see for example, K. D. Merkel and W. R. Babbitt, "Optical Coherent Transient True-time Delay Regenerator," *Opt. Lett.* 21, 1102 (1996)) and optical spatial router (for example, W. R. Babbit and T. W. Mossberg, "Spatial Routing of Optical Beams Through Time-domain Spatial-spectral Filtering," *Opt. Lett.* 20, 910 (1995)), among others. While each device has different aspects in its programming and processing stages, all are implementations of a generalized OCT processor. The term processor here indicates the most generalized conceptualization of such a device.

OCT devices can only process data as long as the programmed spatial-spectral grating survives. When the programming stage is a single shot event, writing a strong spectral grating in a non-persistent hole-burning material, the processing stage can only occur while the excited absorbers have not decayed back to their ground states. After the grating decays away fully, the programming stage can be repeated, but this leads to dead time for the processor, which is several times the excited state lifetime $T_1$. An alternative implementation is to utilize persistent spectral holes. But for single photon persistent holes (e.g., hyperfine storage), the processing stage is partially destructive to the stored gratings, (for example, M. Zhu, W. R. Babbitt and C. M. Jefferson, "Continuous Coherent Transient Optical Processing in a Solid," *Opt. Lett.* 20, 2514 (1995)). For two-photon persistent holes, i.e., gated storage, (for example, W. E. Moerner, Editor. *Persistent Spectral Holeburning: Science and Applications*, Topics in Current Physics, Vol. 44, Springer-Verlag, 1988), the processing stage is non-destructive and can be continuous. However, low writing and gating efficiencies of available materials make this currently impractical. Each of the above techniques requires strong programming pulses and weak processing pulses, thereby putting stringent specifications on the laser source and optical modulators. These constraints could be lessened if the grating were accumulated by repeating the programming process. However, the temporal distinction between the programming and processing stages still remains for all the above techniques, along with the constraints on efficiency, materials and devices.

Previously, a continuous OCT processor has been proposed and demonstrated whereby the programming stage and the processing stage are two temporally distinct steps. Furthermore, previous continuous OCT processors required two spatially distinct programming beams to write a spatial-spectral population grating and a third beam to read. However, in the previous OCT processor, the first and third beams are typically specified to be the same, which makes the emitted output signal spatially distinct from the subsequently applied continuous processing data stream. Consequently, the programming and processing stages cannot be overlapped in time.

Previously, storage of the grating required a persistence of the spectral holes at least as long as the processing stage step. Herein spectral holes that naturally persist much longer than the processing stage step without further programming are called persistent spectral holes, and the remaining holes are termed non-persistent spectral holes.

Previously, the efficiency of the system for long term storage was greatly limited by the material's ability to efficiently transfer electron populations to persistent states.

Previously, reprogramming required either a means by which to erase or to decay away the stored grating, or, to change the spatial location where a grating is stored so as to address new atoms.

A previously known technique for accumulated gratings for photon echoes, is used to see extremely weak photon echo signals by repeated application of two brief reference pulses (for example, W. H. Hesselink and D. A. Wiersma, "Photon Echoes from an Accumulated Grating: Theory of Generation and Detection," *J. Chem. Phys.*, 75, 4192 (1981)). Accumulated gratings have never been previously considered for processing, nor has the advantage of high efficiency gratings for optical processing been noted in any publication or in the art known to the inventors.

There is a need for a device in which the programming and processing can occur continuously, simultaneously and asynchronously.

SUMMARY OF THE INVENTION

It is an objective of the present invention to provide a device in which the programming of a spatial-spectral grating and processing using that grating can occur continuously, simultaneously and asynchronously. It is a feature of one aspect of the present invention to provide a method for achieving continuous processing in materials that do not exhibit long term persistent hole burning. A grating is accumulated and maintained regardless of the material's ability to transfer ion populations to persistent states. In the present invention, the material adapts to new programming pulses in a continuous manner within the grating lifetime, either the excited state lifetime $T_1$, or the intermediate state lifetime TB in the case of a three-level system, if $T_B > T_1$.

It is a feature of another aspect of the present invention to accumulate and repeatedly refresh the stored grating by repeatedly applying the programming sequence by repeated application of two or more spatially distinct programming pulses to a non-persistent hole-burning material.

It is a feature of another aspect of the present invention to provide an input beam geometry that isolates the emitted signal from all the input waveforms so that the optical signal processor can process simultaneously, asynchronously, and continuously a processing input signal while it is being continuously programmed.

It is a feature of one aspect of the present invention to provide an input beam geometry that has the benefit that non-linearities introduced by the multiple programming stages do not lead to harmonics of the delay in the output signal direction in, at least, the case of true time delay regenerators.

It is a feature of one embodiment of the present invention to provide two spatially distinct programming beams to write a spatial-spectral population grating and to provide a third spatially distinct processing beam, whereby the emitted output signal is spatially distinct from the subsequently applied continuous input data stream on the processing beam, and the programming beams, and thus can temporally overlap them.

It is a feature of another embodiment of the present invention to provide three (or more) spatially distinct programming beams to write a spatial-spectral population grating and to provide a fourth (or higher) spatially distinct processing beam, whereby the emitted output signal is spatially distinct from the subsequently applied continuous input data stream on the processing beam, and the programming beams, and thus can temporally overlap them.

It is a feature of another embodiment of the present invention to provide for angular demultiplexing and multiplexing of gratings stored in a particular spatial location by varying the beam directions of one or more of the programming pulses, respectively, while still maintaining the phase matching conditions of the input pulse geometry.

It is a feature of another embodiment of the present invention to provide a system that can fully process a temporally structured waveform (TSW) modulated in amplitude and phase at projected data rates typically greater than 10 GHz and with time-bandwidth products typically greater than 1000.

It is a feature of the present invention to provide efficient and continuous processing in an absorptive material system that has an inhomogeneously broadened transition (IBT) spectrum between ion states. The system can be, but is not limited to, a two-level transition, three-level (multi-level) with one (or more) intermediate states between the upper and lower levels of the IBT, or multi-level with transitions outside of the IBT, as applicable for optical pumping.

It is a feature of an aspect of the present invention to provide for reprogramming of the processor simply by changing the programming pulses. This feature also allows the processor to adapt to frequency drift of the system's laser source and can be used in adaptive learning of unknown patterns.

In brief, a novel method and system for programming and processing coherent transient devices is described herein. The method and system utilizes distinct processing and programming beams, making it possible to simultaneously program a grating and process a waveform against it, continuously and asynchronously. The method and system has utility in the processing of optical waveforms for optical or electronic means. New delays, patterns or other spectral gratings can be programmed into the material to a steady state by accumulation, with a programming time on the order of the grating lifetime. New delays, patterns or other spectral gratings can be programmed to their steady state value in a single shot, quickly, and then maintained at that steady state value with continuously applied programming waveforms. Reprogramming of new delays, patterns or other spectral gratings can be achieved with reprogramming time roughly equal to the grating lifetime. Quicker methods for reprogramming a spectral grating can be utilized as well. These programming methods alleviate the need for photon gating in several types of OCT devices, specifically optical memory (i.e. optical DRAM), temporally structured waveform cross-correlators, and true-time delay regenerators. For both pattern storage, as used in a memory and for correlation processing, and for a true-time delay regenerator, simulations show the efficiency to be on the order of that for a perfect photon-gated system. Existing materials offer multigigahertz, efficient, real-time processing with large time bandwidth products (>1000).

The foregoing needs and objects, and other needs and objects that will become apparent from the following description, are achieved by the present invention, which comprises, in one aspect, an electromagnetic wave coherent transient device having a medium with an inhomogeneously broadened transition absorption spectrum and with a relaxation time during which modifications to the inhomogeneously broadened transition absorption spectrum substantially decay away. A plurality of programming paths impinge on the medium from a plurality of corresponding programming path directions. A processing path impingies on the medium from a processing direction. An output path emanates from the medium in an output direction. The output direction, the processing direction and each direction of the plurality of corresponding programming path directions are phase matched so the output direction is different from the processing direction and different from each direction of the plurality of corresponding programming path directions.

In another aspect of the invention, an electromagnetic wave coherent transient device also includes a medium having an inhomogeneously broadened transition absorption spectrum and a relaxation time during which modifications to the inhomogeneously broadened transition absorption spectrum substantially decay away. In this embodiment there is a programming source of a plurality of modulated programming pulses to form a modified transition absorption spectrum in the medium, and a processing signal source. The processing signal source is configured to send a processing signal onto a certain location in the medium during a processing time interval. The programming source is configured to send the plurality of modulated programming pulses onto a location that at least partially overlaps the certain location during a programming signal time that overlaps in time the processing time interval.

Another aspect of the invention is a method of using a coherent electromagnetic wave transient device. The device has a medium with an inhomogeneously broadened transition absorption spectrum and a relaxation time during which modifications to the inhomogeneously broadened transition absorption spectrum substantially decay away. The device also has a plurality of programming paths impinging on the medium from a plurality of corresponding programming path directions, a processing path impinging on the medium from a processing direction, and an output path emanating from the medium in an output direction. The method includes sending a plurality of programming pulses along the plurality of programming paths during a programming signal duration to form a modified transition absorption spectrum in the medium. A processing signal of arbitrary duration that overlaps in time at least one programming pulse of the plurality of programming pulses is sent along the processing path. An output signal of arbitrary duration is received along the output path in response to the processing signal.

In another aspect of the invention, an optical coherent transient device includes one or more lasers emitting optical radiation at a carrier frequency. The optical radiation is modulated to form a processing waveform on a processing path and a plurality of programming pulses on a plurality of corresponding programming paths. A medium has an inhomogeneously broadened transition absorption spectrum and a relaxation time during which modifications to the inhomogeneously broadened transition absorption spectrum substantially decay away. The processing signal impinges onto a certain location in the medium during a processing time interval. A programming signal impinges onto a location that at least partially overlaps the certain location during a programming signal time that overlaps in time the processing time interval. The programming signals form a modified transition absorption spectrum.

In another aspect of the invention, an optical coherent transient device includes one or more lasers emitting electromagnetic radiation at a carrier frequency. A processing waveform is formed on a processing path. A plurality of programming pulses are formed on a plurality of corresponding programming paths. A medium has an inhomogeneously broadened transition absorption spectrum and a relaxation time during which modifications to the inhomogeneously broadened transition absorption spectrum substantially decay away. The plurality of corresponding programming paths impinge on the medium from a plurality of corresponding programming path directions. The processing optical path impinges on the medium from a processing direction. An output optical path emanates from the medium in an output direction. The output direction, the processing direction and each direction of the plurality of corresponding programming path directions are phase matched so the output direction is different from the processing direction and different from each direction of the plurality of corresponding programming path directions.

BRIEF DESCRIPTION OF THE DRAWINGS

The present invention is illustrated by way of example, and not by way of limitation, in the figures of the accompanying drawings and in which like reference numerals refer to similar elements and in which:

FIGS. 2B and 2C are diagrams illustrating a continuously programmed continuous processor and timing parameters for the three distinct input beams of FIG. 2A;

FIGS. 3D and 3E are diagrams illustrating a continuously programmed continuous signal cross-correlation processor, and parameters, for the four distinct input beams of FIG. 3A;

DETAILED DESCRIPTION OF THE PREFERRED EMBODIMENTS

Figure 1A:
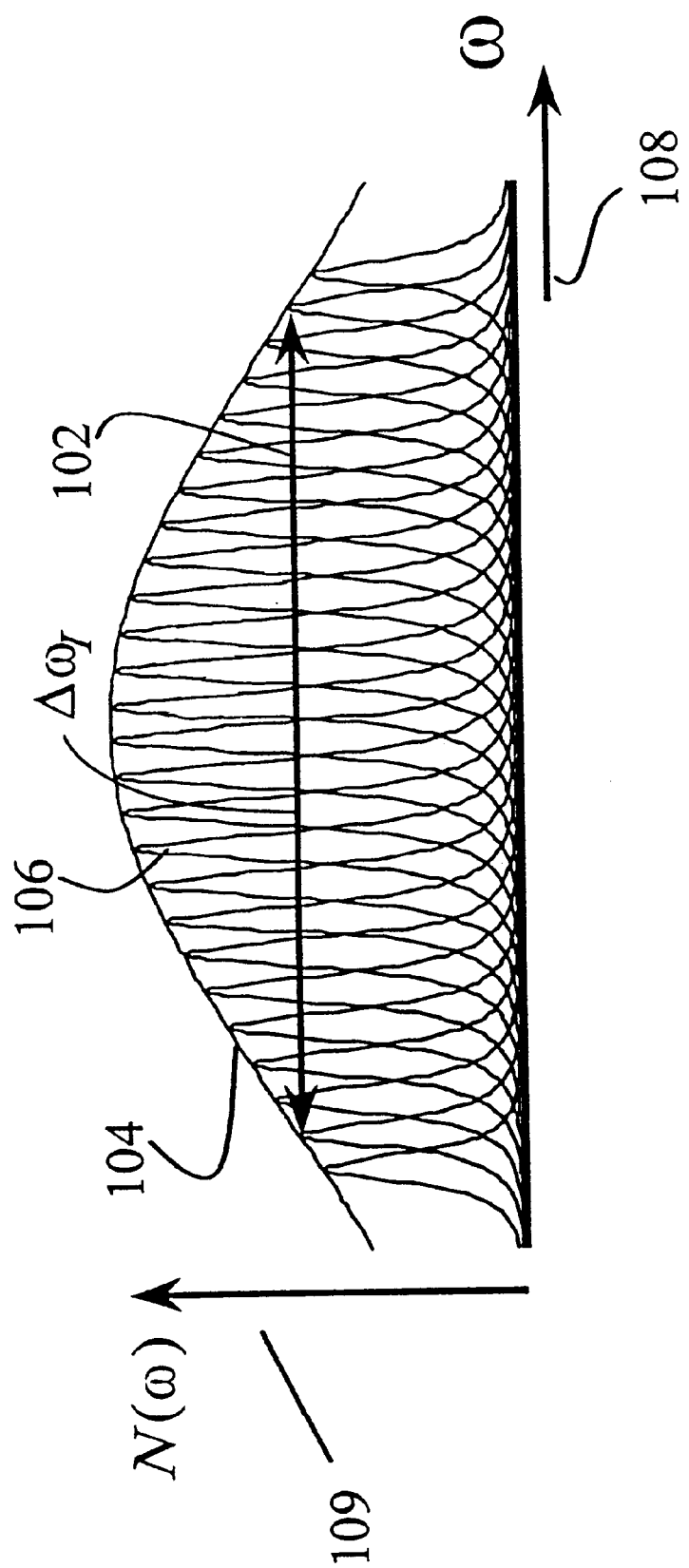
FIG. 1A is a diagram showing an inhomogeneously broadened absorption spectrum.

This invention relates to a novel method and apparatus for programming and processing in an absorbing medium. The end result is the generation of an emitted signal from the device, for use in optical, electromagnetic wave or electronic systems. The particular choice of an absorbing medium is crucial for the invention to properly function, and should at least include the presence of an inhomogeneously broadened transition (IBT) as shown in FIG. 1A at the electromagnetic frequencies of interest. For illustrative purposes only, examples are explored to show how the invention functions, using either (1) two distinct optical beams for programming and one beam for input or (2) three distinct optical beams for programming and one beam for input. These two modes are considered to be the best embodiments of the invention, although in general, N programming beams and non-optical frequencies can be used.

Figure 1B:
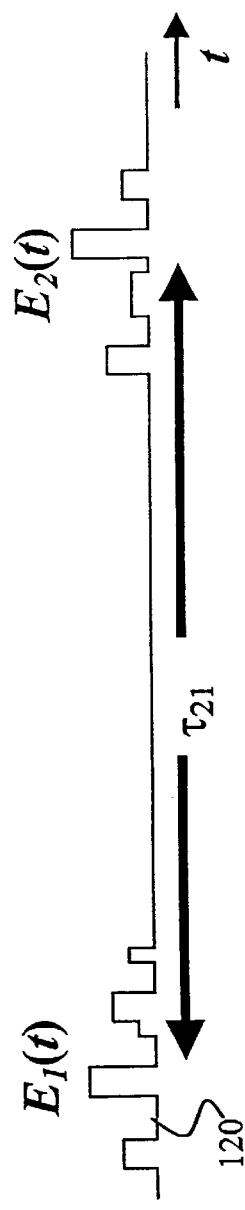
FIG. 1B is a time line graph showing an example pair of programming pulses.

In a one aspect, programming takes place by the repeated application of two or more spatially distinct optical programming waveforms, such as $E_1(t)$ and $E_2(t)$ shown in FIG. 1B, onto a non-persistent hole-burning material, in order to write and maintain an accumulated, spatial-spectral population grating. Once accumulated, this grating can be used for processing, in which the desired result is the generation of an optical output signal containing information. The output signal is generated by the application of another optical waveform, called the processing waveform, that is introduced along another spatial direction, and incident on the same absorbing medium that is being continuously programmed. The processing waveform can be continuous and indefinitely long in duration. Programming and processing take place siriiultaneously, asynchronously and continuously.

The information in the generated optical signal may be (1) an optical waveform representing a replica or time reversed replica of one of the programming waveforms as is useful in optical memory, (2) a cross-correlation or convolution of one of the programming waveforms with the processing waveform as is useful in an optical signal correlator/convolver, in pulse shaping or in distortion compensation, (3) a precise time-delayed optical pulse or pulses as is useful in an optical true-time delay regenerator, (4) a unique spatial and/or temporal code for routing or other applications, or (5) other information bearing signals that have not been previously proposed. These various output options depend on the order, timing and essence of each applied waveform. The invention is applicable to a generalized processor that includes all of these cases.

In general, an optical coherent transient (OCT) processor is programmed with two or more temporally modulated optical pulses that are separated in time and resonant with an inhomogeneously broadened transition (IBT). Each laser pulse has a form $E_n(t-t-\eta_n)\cos(\omega_0(t-\eta_n))$, where the n subscript determines the order of arrival of each pulse, $E_n(\tau)$ is a slowly varying temporal envelope function, $\omega_0$ is the laser center frequency, $\eta_n = (\hat{k}_n \cdot \vec{r}/c)$, where $\hat{k}_n$ is the unit wavevector of pulse n, $\phi_n$ is the phase of pulse n, and each pulse reaches the medium at $\vec{r}=0$ at its arrival time $t_n$. A programming pulse can be among a temporally brief reference pulse (BRP), a linear frequency-chirped reference pulse (LFCP), or a temporally structured waveform (TSW), or other pulses not described here. Generally, a TSW is an optical waveform that is temporally, spatially or spectrally modulated as applicable to performing a particular signal processing function. For example, in various embodiments, a TSW is a stream of temporal amplitude, frequency, and/or phase modulated sub-pulses to represent data, or formed by spectral modulation of a BRP or other waveforms, as in pulse shaping, or formed by one or more spatially distributed waveforms such as associated with an image or a pixel of an image.

In another embodiment, frequency division multiplexed storage and processing are achieved where different sets of programming pulses with different laser center frequencies act on different parts of the inhomogeneously broadened absorption spectrum.

As used herein, a beam indicates a distinct spatial path on which an electromagnetic wave signal is incident onto, or emitted from, the absorbing medium.

Programming With Two Pulses on Two Programming Beams

Figure 1C:
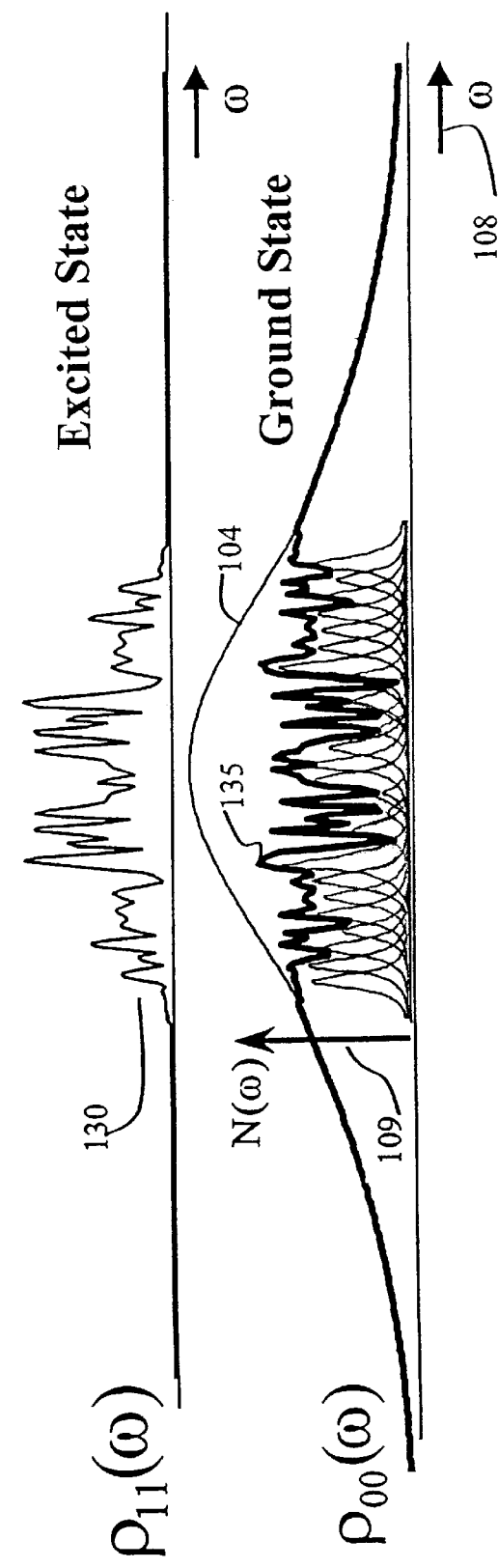
FIG. 1C is a diagram comparing example population spectra of molecules in an excited state and those in a ground state after passage of the programming pulses of FIG. 1B.

As shown in FIG. 1B, two waveform envelopes $E_1(\tau)$ and $E_2(\tau)$ as separated by $\tau_{21}=t_2-t_1$ can be used to write a spatial-spectral holographic population grating on the IBT. This grating is produced by transferring some population of ions or molecules into an excited state with spectrum $\rho_{11}(\omega)$ (such as 130 in FIG. 1C) and the residual in a ground state $\rho_{00}(\omega)$ (such as 135 in FIG. 1C).

After a grating is programmed, the atomic absorption is selective in both frequency and space for subsequently applied optical waveforms. Within the grating lifetime, a subsequently applied waveform, i.e. $E_3(\tau)$ in the case of two programming pulses, causes a coherent emission $E_S(t-t_S-\eta_S)\cos(\omega_0(t-\eta_S)+\phi_S)$ from the IBT with the temporal envelope of the form $$E_s(t-t_s-\eta_s) \propto \int_{-\infty}^{\infty} E_1^*(\Omega) E_2(\Omega) E_3(\Omega) e^{i\Omega(t-t_s-\eta_s)} d\Omega \quad (1)$$

where $t_S=t_3+t_2-t_1$, $\eta_S=\eta_3+\eta_2-\eta_1$, $\phi_S=\phi_3+\phi_2-\phi_1$, and $E_n(\Omega)$ transform of the nth applied optical waveform envelope, $E_n(\tau)$. Equation (1) is based on the Fourier Transform approximation of the input temporal waveforms, and is valid for waveforms with bandwidths less than the inhomogeneous linewidth, $\delta\omega_1$ (FIG. 1A 102), and intensities that insure a linear response, avoiding both coherent and incoherent saturation. The processing pulse also can be, but is not limited to, a BRP, a LFCP, a TSW, or other pulses not described here. If any applied optical waveform $E_n(\tau)$ has a bandwidth greater than $\delta\omega_1$, the material acts as a low pass band filter on the spectral features of these waveforms.

This technology includes, but is not limited to OCT devices that perform a variety of known functions using the following new order and character of input pulses.

1. In some embodiments, an optical memory is constructed if the product $E_1^*(\Omega)E_3(\Omega)$ is nearly flat over the bandwidth of a TSW $E_2(\tau)$. This is made, for example, by using two BRP's, two LFCP's or two TSW's that strongly auto-correlate. In this case, the output signal mimics $E_2(\tau)$. Alternatively, an optical memory is constructed, for example, if the product $E_2(\Omega)E_3(\Omega)$ is nearly flat over the bandwidth of a TSW $E_1(\tau)$. In this case, the output signal mimics $E_1(\tau)$, time reversed. Other embodiments use the principles of a swept carrier which combines regular storage described above with chirped pulses. In these embodiments the programming pulses are deployed according to processes for using a swept carrier.

2. In other embodiments, an optical signal correlator/convolver is constructed if more than one of the input waveforms is a TSW. For example, a signal cross-correlator is achieved by making $E_1(\tau)$ a pattern TSW, and making $E_2(\tau)$ a BRP. The processing waveform $E_3(\tau)$ is a TSW, and the output waveform represents the correlation of pattern TSW with the processing TSW. For example, a signal convolver is achieved by making $E_1(\tau)$ a BRP and making $E_2(\tau)$ a pattern TSW. The processing waveform is a TSW and the output waveform represents the convolution of the pattern TSW with the processing TSW.

3. In other embodiments, an optical TTD regenerator is constructed when the product $E_1^*(\Omega)E_2(\Omega)$ is nearly flat over the bandwidth of a TSW $E_3(\tau)$. This can be made by using two BRP's, two LFCP's or two TSW's that strongly auto-correlate. In this case, the output signal mimics $E_3(\tau)$, but delayed.

4. In other embodiment, an optical spatial signal router is achieved, for example, by making $E_1(\tau)$ one of several different TSWs and $E_2(\tau)$ a BRP. Each $E_1(\tau)$ is programmed along a different angular direction while maintaining the phase matching conditions described below, and keeping a second programming pulse direction constant. When $E_3(\tau)$ is a TSW that autocorrelates with one of the several programmed TSWs, the output signal will be an autocorrelation of the TSW in a unique direction of interest as determined by the phase matching conditions.

5. In other embodiments, an optical spatial signal multiplexer is achieved, for example, by applying different $E_1(\tau)$ and $E_2(\tau)$ pairs while making $E_2(\tau)$ waveforms along different angular directions. Multiple $E3(\tau)$ waveforms are applied along a multitude of directions that maintain the phase matching conditions. The output signal is a coherent sum of the individual outputs due to various inputs, and this output signal is emitted along a single direction.

6. In other embodiments, an OCT spectrum analyzer is achieved with a combination of chirped reference pulses and angular multiplexing. A pulse's frequency and angle of programming are swept together, mapping a particular frequency range into an angle. Thus, different frequencies correspond to physical locations, that can be aligned with different detectors or regions of a detector, e.g., a charge coupled device (CCD) such as a CCD camera. The programming pulse sequence consists of a two chirped pulses, where at least one of these chirped pulses is swept over a range of angles when being programmed. The processing pulse is a TSW that is the pulse to be analyzed in terms of its spectral components, and the corresponding spectral components come out at different angles, similar to an angular demultiplexer.

Input Beam Geometry for Two Programming Beams

A programming beam indicates a distinct path on which an electromagnetic wave signal is incident onto the absorbing medium. For the case of two programming pulses, there are three input beams, two for programming and one for processing, and these paths are referred as the first, second and third beams, with unit wavevectors $\hat{k}_1$, $\hat{k}_2$, and $\hat{k}_3$, respectively. In the case of two programming pulses, the phase matching condition for the proposed continuous processing and programming technique is $\hat{k}_S \cong \hat{k}_3+\hat{k}_2-\hat{k}_1$, following the general conditions of phase matching for non linear processes as is well known to persons skilled in that art. A particular geometry for these beams is described below, and schematically shown in FIG. 2A. The invention in not limited to this particular configuration, but a configuration in this manner or variations on this configuration is preferred.

Figure 2A:
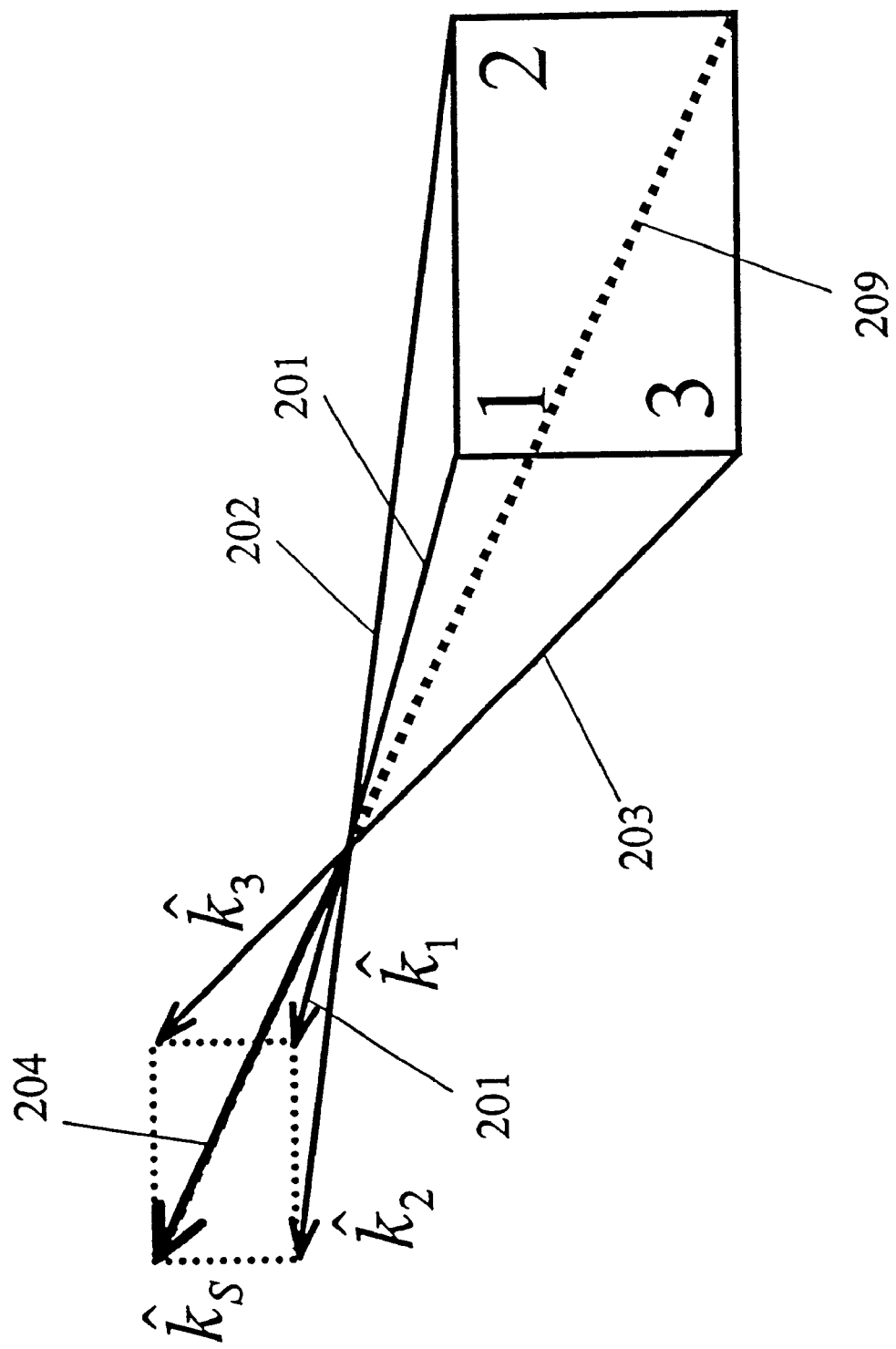
FIG. 2A is a diagram illustrating an example of a phase matched input beam geometry for three distinct input beams, two programming beams and one processing beam, and the direction of the emitted output signal.

FIG. 2A shows a three-dimensional representation of a scheme for the preferred embodiment in the case where all three input pulses are distinct such that $\hat{k}_1 \neq \hat{k}_2 \neq \hat{k}_3$. In this case, phase matching is achieved if the pulses are directed such that, for a given vector $\vec{k}_0$ (not shown), the individual wavevectors are $\hat{k}_n = \vec{k}_0 + \delta\vec{k}_n$, where for n=1, 2, 3, every $|\delta\vec{k}_n|$ is equal, $\delta\vec{k}_n \perp \vec{k}_0$, and $\delta\vec{k}_3 = -\delta\vec{k}_2$.

Angular demultiplexing and multiplexing options are each possible, while maintaining the phase matching conditions. Both angular demultiplexing and angular multiplexing refer to the storage of several spatial-spectral gratings in a single spatial location due to multiple input pulse-pairs applied along different angular directions.

Angular demultiplexing is achieved by varying $\delta\vec{k}_1$ while keeping $\delta\vec{k}_2$ and $\delta\vec{k}_3$ fixed. In this case, the different gratings are used for processing by an input waveform applied along one spatial direction. The input waveform $E_3(\tau)$ along $\hat{k}_3$ results in multiple signals along multiple output directions $\hat{k}_s = \vec{k}_0 - \delta\vec{k}_1$, perhaps simultaneously. This is useful in either fanning/broadcasting of signals or in an optical router.

Alternatively, angular multiplexing can be achieved by fixing $\delta\vec{k}_1$ and varying $\delta\vec{k}_2$. This implies that $\delta\vec{k}_3$ must be varied, making it possible to apply an $E_3(\tau)$ waveform along any direction that satisfies the condition $\delta\vec{k}_2 = -\delta\vec{k}_3$. In this case, the different gratings are used for processing by several input waveforms applied along several different input directions. The output signals are emitted along one direction $\hat{k}_s = \vec{k}_0 - \delta\vec{k}_1$, and consists of the coherent sum of all of the emitted outputs. This is useful in communication networks, spatial-temporal image processing, optical summing devices or in receiver detectors of array antenna beamforming.

An image can be stored using angular multiplexing to represent different pixels in the image on different angles. In essence, the spectral Fourier processing of the IBT can combined with conventional Fourier spatial image processing. Such an embodiment of an OCT can be used for spatial-temporal image processing. In general, the input beam directions are phase matched to produce spatial-temporal output signals that are distinct from the transmitted input signals. However, in the case of image processing, one embodiment has a programming beam path spatially overlapping the phase matched output direction. In this embodiment, it is the spatial-temporal output signal that is not simultaneously temporally and spatially overlapping the transmitted programming pulses that is considered the valid signal. That is, while a programming pulse is on the overlapping path, the output on that path is ignored. The output not overlapped by this path can continue to be used.

Repeated Programming and Continuous Processing

Several embodiments of one aspect of the present invention are methods of programming and processing using the input beam geometry as described in FIG. 2A. FIGS. 2B and 2C illustrate a continuously programmed continuous processor and its timing parameters. As is shown in FIG. 2B, a pair of programming pulses $E_1^{(J)}(\tau)$ and $E_2^{(J)}(\tau)$ is repeated along first beam 210 and second beam 220 at regular intervals $\tau_R$ in order to accumulate a grating such as, for example, a spatial-spectral population grating formed in the IBT 290. The repeated waveform pairs at the appropriate intensity can be used to form an accumulated grating, where after reaching steady state, their repeated application maintains the grating in a steady state, and their application exactly compensates for the relaxation losses $\tau_R$. Once the grating is accumulated, the waveform pairs maintain the grating in a steady state. In another embodiment, a grating can be written to a strength nearly identical to that of the steady state value in a single shot, and then maintained in steady state by waveform pairs. The waveform to be processed can be propagated along third beam 230. As is shown in FIG. 2B, the processing waveform along third beam can be continuous. Due to the inputs shown in FIG. 2B, an optical output signal is emitted along the direction $\hat{k}_S$ 240 shown in relation to the processing waveform on third beam 230 in FIG. 2C. FIG. 2C shows the shape and timing of the resulting output signal emitted along $\hat{k}_S$, with respect to the third pulse after it exits the medium. Here, this signal consists of a continuous waveform. Outputs along first beam 210 and second beam 220 are not shown in FIG. 2C.

Figure 2D:
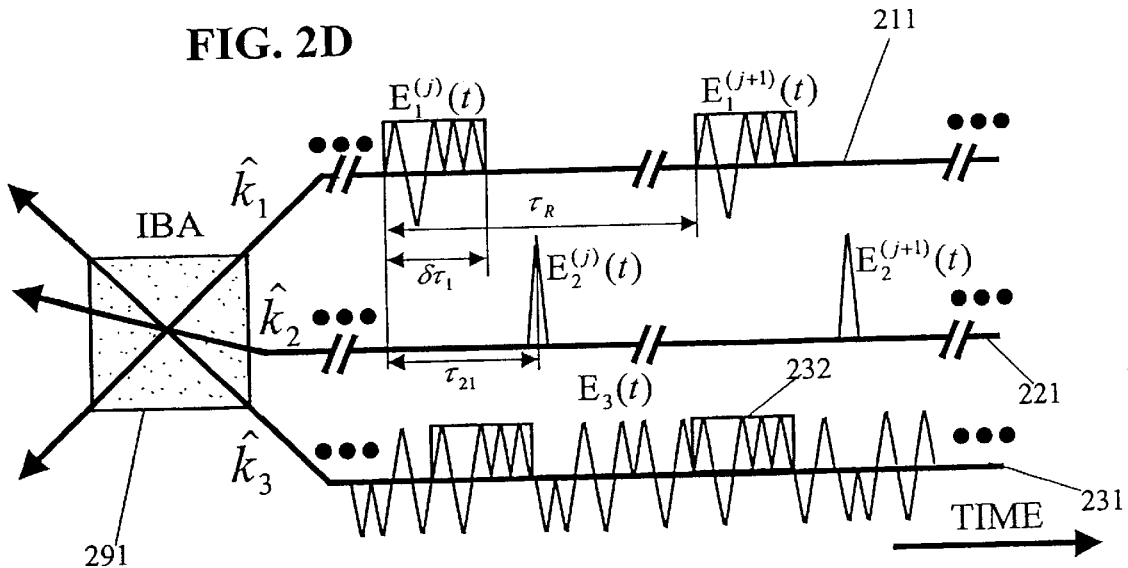
FIGS. 2D and 2E are diagrams illustrating a continuously programmed continuous signal cross-correlation processor, and parameters, for the three distinct input beams of FIG. 2A.
Figure 2E:
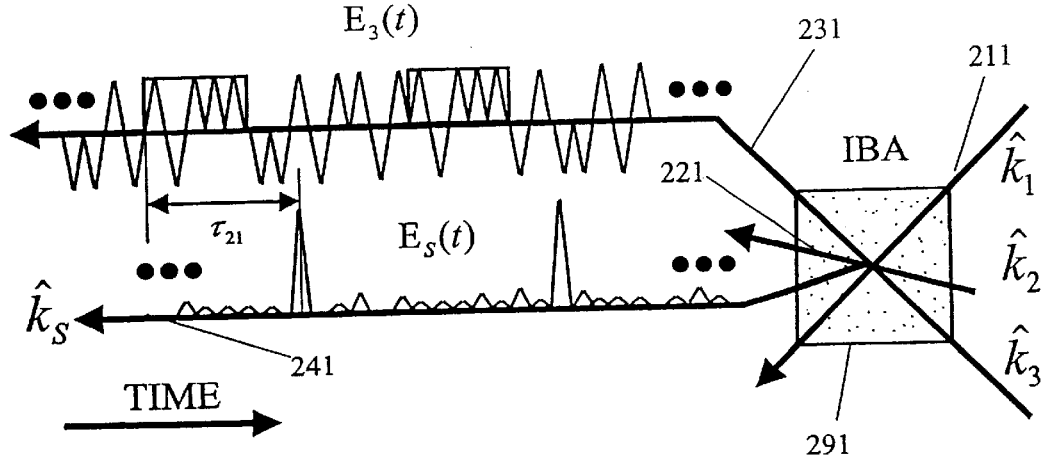

Referring to FIGS. 2D and 2E, the complete spatial-temporal implementation for the input pulses is illustrated for a specific embodiment of a signal cross-correlator. In FIG. 2D, a pair of programming pulses $E_1^{(J)}(\tau)$ and $E_2^{(J)}(\tau)$ is repeated at regular intervals $\tau_R$ along first and second beams 211 and 221, respectively. The first programming pulse is a TSW on first beam 211 and the second programming pulse is a BRP on second beam 221. Once the grating is accumulated or written and is being maintained in a steady state in IBT 291, the waveform to be processed can be propagated along third beam 231. Here, the programmed pattern is included twice in this waveform, as indicated by the overbar 232 in FIG. 2D. FIG. 2E illustrates the shape and timing of the resulting output signal emitted along $\hat{k}_S$ 241, with respect to the third pulse 231 after it exits the medium 391. Here, this signal consists of two auto-correlation peaks, each following the pattern indicated by the overbar 232 by time $\tau_{21}$ and other correlation signals. These signals should continue to be observed, provided the accumulated grating does not saturate and distort.

Programming With Three Programming Pulses on Three Beams

In another preferred embodiment, programming takes place by the repeated application of three spatially distinct optical waveforms, $E_1(t)$, $E_2(t)$, and $E_3(t)$ onto a non-persistent hole-burning material, in order to write and maintain an accumulated, spatial-spectral population grating. The geometry of the programming, processing and output beams are related to the wavenumber vectors shown in FIG. 3A and will be described in more detail below.

This technology includes, but is not limited to OCT devices that perform a variety of known functions using the following new order and character of input pulses.

1. In some embodiments, an optical memory is constructed if one of the three programming pulses is a TSW, and the other two programming pulses act together as a single reference pulse to store that pattern in a spectral grating. The fourth pulse $E_4(\tau)$ acts to probe this grating, stimulating a response that mimics the stored TSW, or mimics it time reversed. This case also works if the spectral product of all three pulses that are not a TSW have a nearly flat response over the bandwidth of the TSW.

2. In other embodiments, an optical signal correlator/convolver is constructed, for example, if more than one of the input waveforms is a TSW. For example, a signal cross-correlator is achieved by making $E_1(\tau)$ a pattern TSW, and making $E_2(\tau)$ and $E_3(\tau)$ together acts as a single BRP, where $E_2(\tau)$ should act to convert coherences to coherences (a second order interaction). The processing waveform $E_4(\tau)$ is a TSW, and the output waveform represents the correlation of pattern TSW with the processing TSW. For example, a signal convolver is achieved by making $E_1(\tau)$ and $E_2(\tau)$ together act as a single BRP, where $E_2(\tau)$ should act to convert coherences to coherences (a second order interaction), and making $E_3(\tau)$ a pattern TSW. The processing waveform $E_4(\tau)$ is a TSW and the output waveform represents the convolution of the pattern TSW with the processing TSW. The timings of these pulses are a factor in the operation of these devices. In a three programming pulse convolver, the plurality of programming pulses include a first frequency chirped pulse, a second frequency chirped pulse, and a first temporally structured pulse. The first and second frequency chirped pulses precede the first temporally structured pulse. A chirp rate of the first frequency chirped pulses is one half of a chirp rate of the second frequency chirped pulse. Then the processing pulse is applied as a second temporally structured pulse to substantially produce a convolution of the first temporally structured pulse with the second temporally structured pulse. General timing considerations are described more below.

3. In other embodiments, an optical TTD regenerator is constructed with three programming pulses whose product is nearly flat over the bandwidth of a TSW $E_4(\tau)$, and these programming pulses act to store a periodic frequency grating representing a true time delay. This can be done with a variety of input pulses. In this case, the output signal mimics $E_4(\tau)$, but delayed.

4. In other embodiments, an optical spatial signal router is achieved, for example, by making $E_1(\tau)$ one of several different TSWs and $E_2(\tau)$ and $E_3(\tau)$ a combination of pulses that store the various TSWs as spectral gratings. Each $E_1(\tau)$ is programmed along a different angular direction while maintaining the phase matching conditions described below, and keeping the directions of the other programming pulses direction constant. When $E_4(\tau)$ is a TSW that autocorrelates with one of the several programmed TSWs, the output signal will be an autocorrelation of the TSW in a unique direction of interest as determined by the phase matching conditions.

5. In other embodiments, an optical spatial signal multiplexer is achieved by applying at least one of the programming pulses along several different unique angular spatial directions, and making multiple $E_4(\tau)$ waveforms be applied along a multitude of directions that maintain the phase matching conditions. The output signal is a coherent sum of the individual outputs due to various inputs, and this output signal is emitted along a single direction.

Input Beam Geometry for Three Programming Beams

When programming with three beams and processing with one beam, according to these embodiments, optical signals are incident along four distinct paths to the absorbing medium. These paths are referred as the first, second, third and fourth beams, with unit wavevectors $\hat{k}_1$, $\hat{k}_2$, $\hat{k}_3$, and $k_4$, respectively. A particular geometry for these beams is described below, and schematically shown in FIG. 3A. The invention in not limited to this particular configuration, but a configuration in this manner or variations on this configuration is preferred.

Figure 3A:
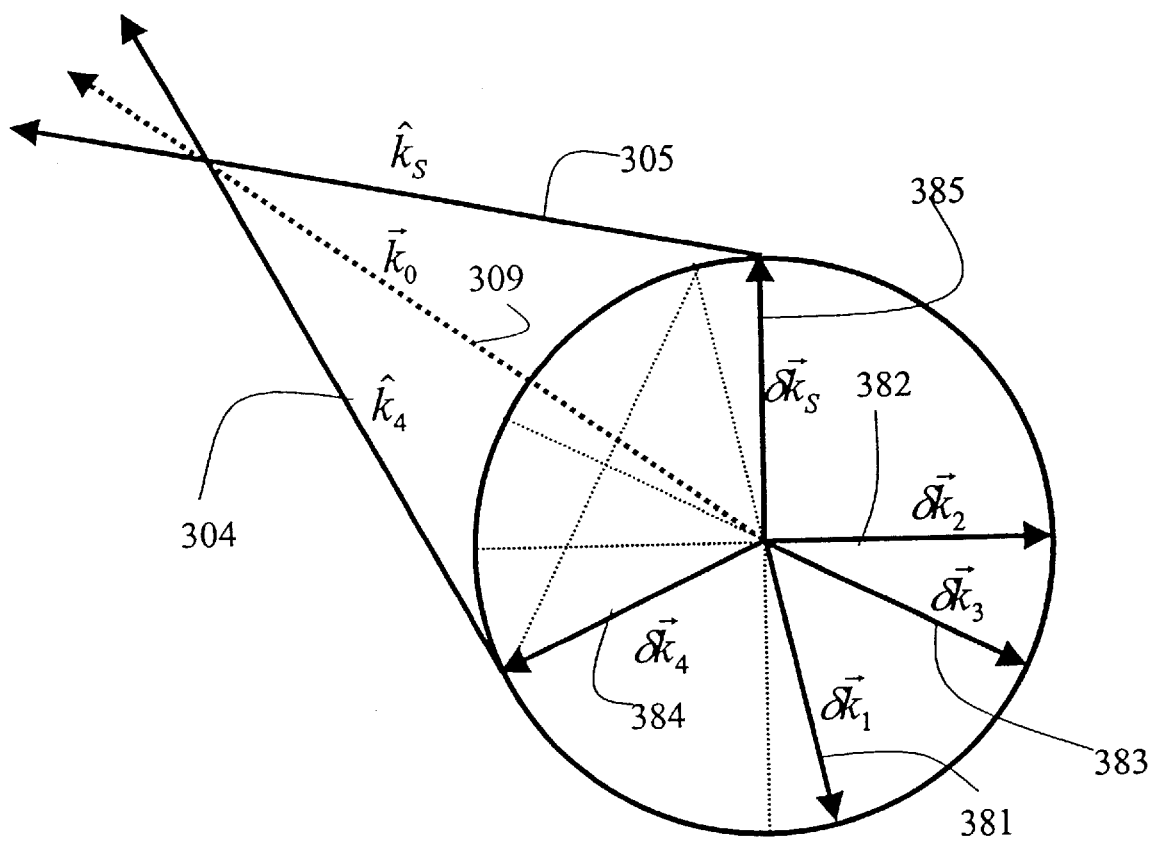
FIG. 3A is a diagram illustrating an example of a phase matched input beam geometry for four distinct input beams, three programming beams, and one processing beam, and the direction of the emitted output signal.

The phase matching condition for one processing beam for continuous processing and programming is $\hat{k}_S \cong \hat{k}_4 - \hat{k}_3 + 2\hat{k}_2 - \hat{k}_1$ in one set of embodiments or $\hat{k}_S \cong \hat{k}_4 + \hat{k}_3 - 2\hat{k}_2 + \hat{k}_1$ in another set of embodiments. The embodiment chosen depends on the timing of the programming pulses with relationship to each other, in a manner that is determined according to the particular application but is not described further here. FIG. 3A shows a three-dimensional representation of one of many solutions to the phase matching condition $\hat{k}_S \cong \hat{k}_4 - \hat{k}_3 + 2\hat{k}_2 - \hat{k}_1$, where $\hat{k}_4 \neq \hat{k}_3 \neq \hat{k}_2 \neq \hat{k}_1$.

Figure 3B:
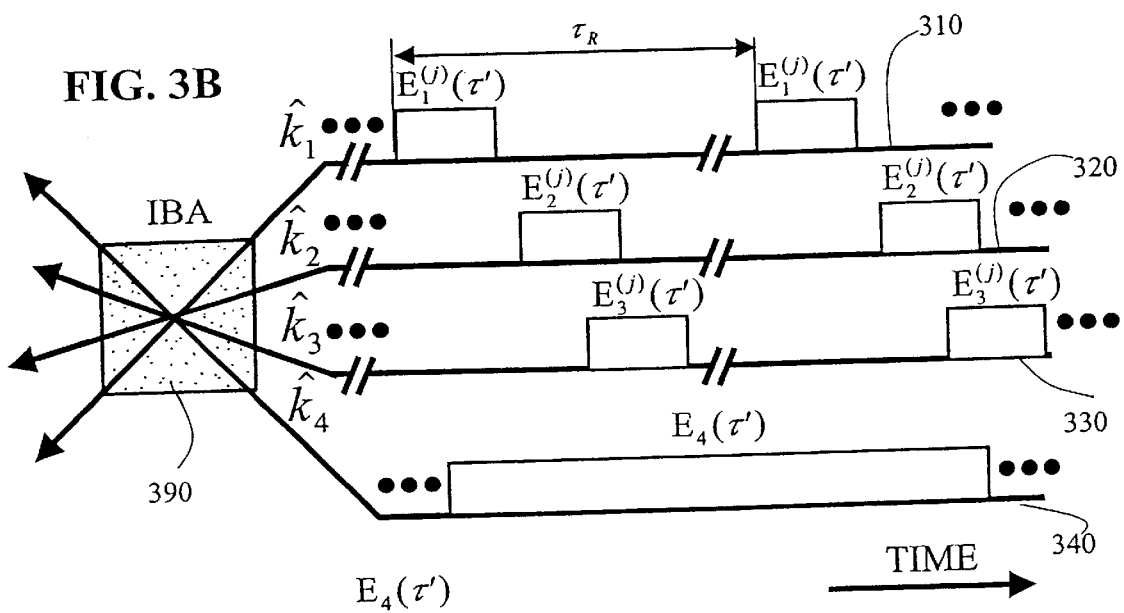
FIGS. 3B and 3C are diagrams illustrating a continuously programmed continuous processor and timing parameters for the four distinct input beams of FIG. 3A.
Figure 3C:
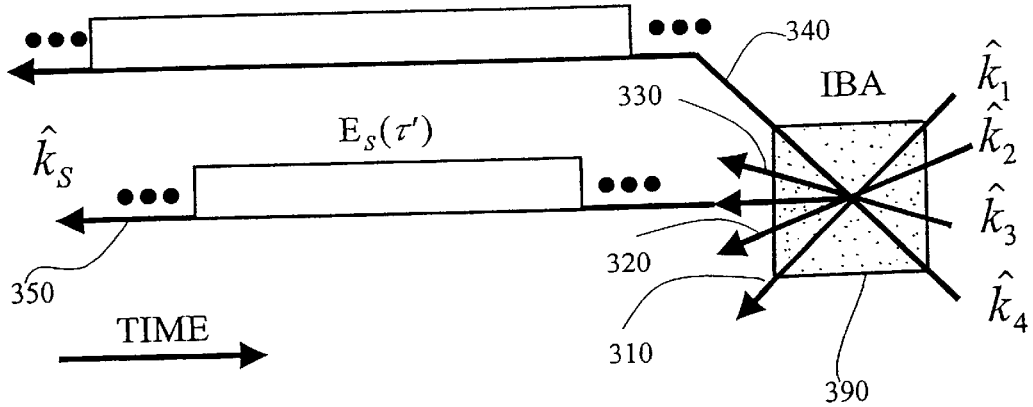

Angular demultiplexing and multiplexing options are each possible, while maintaining the phase matching conditions. Both angular demultiplexing and angular multiplexing refer to the storage of several spatial-spectral gratings in a single spatial location due to multiple input pulse-pairs applied along different angular directions. Both angular demultiplexing and angular multiplexing are possible. Again, an image can be stored using angular multiplexing to represent different pixels in the image on different angles. In essence, the spectral Fourier processing of the IBT can combined with conventional Fourier spatial image processing. Such an embodiment of the OCT can be used for spatial-temporal image processing. Repeated Programming and Continuous Processing One aspect of the present invention is comprised of methods of programming and processing using the input beam geometry as described in FIG. 3A. FIGS. 3B and 3C illustrate a continuously programmed continuous processor and its timing parameters using three programming input beams. As is shown in FIG. 3B, a set of three programming pulses $E_1^{(J)}(\tau)$, $E_2^{(J)}(\tau)$, and $E_3^{(J)}(\tau)$ is repeated along first beam 310, second beam 320 and third beam 3300 at regular intervals $\tau_R$ in order to accumulate a grating such as, for example, a spatial-spectral population grating formed in the IBT 390. In one embodiment, the repeated waveform pairs at the appropriate intensity are used to quickly write and then maintain a grating. In another embodiment, repeated waveform pairs at the appropriate intensity are used to accumulate a grating, where after reaching steady state, their repeated application maintains the grating in a steady state, and their application exactly compensates for the relaxation losses $\tau_R$. Once the grating is accumulated, the waveform set maintains the grating in a steady state. The waveform to be processed can be propagated along a fourth beam 340. As is shown in FIG. 3B, the processing waveform along fourth beam 340 can be continuous. Due to the inputs shown in FIG. 3B, an optical output signal is emitted along the direction $\hat{k}_S$ 350 is shown in relation to the processing waveform on fourth beam 340 in FIG. 3C. FIG. 3C shows the shape and timing of the resulting output signal emitted along $\hat{k}_S$, with respect to the fourth pulse after it exits the medium 390. Here, this signal consists of a continuous waveform. Outputs along first beam 310, second beam 320 and third beam 330 are not shown.

Referring to FIG. 3D, the complete spatial-temporal implementation of the input pulses is illustrated for the specific embodiment of a signal cross-correlator for a particular pattern. In FIG. 3D, a set of programming pulses $E_1^{(J)}(\tau)$, $E_2^{(J)}(\tau)$ and $E_3^{(J)}(\tau)$ is repeated at regular intervals $\tau_R$ along first, second and third beams 311, 321 and 331, respectively. Referring to FIG. 3D, the first programming pulse is a TSW on first beam 311, the second programming pulse is a linear frequency chirped pulse on second beam 321, and the third programming pulse on the third beam 331 is a linear frequency chirped pulses with half the chirp rate of the second programming pulse. The intensities of the chirps should be appropriate so that the fast chirped pulse acts to convert coherences to coherences, and the slow chirp acts to convert coherences to populations. Once the grating is accumulated in IBT 391, the waveform to be processed can be propagated along fourth beam 341. Here, the programmed pattern is included twice in this waveform as indicated by the overbar 332. FIG. 3E illustrates the shape and timing of the resulting output signal emitted along $\hat{k}_S$ 351, with respect to the fourth pulse 341 after it exits the medium 391. Here, the output signal on the fifth beam 351 consists of two auto-correlation peaks and other correlation signals. The output signals should continue, provided the accumulated grating does not saturate and distort. The timing relationship between these pulses is not described here, although it can be determined by one of ordinary skill in the art.

Choice of Material

The material should be an absorbing medium with an inhomogeneously broadened transition (IBT) comprised of narrow homogeneously broadened absorbers. For this IBT, there are at least three choices for the material to be utilized. The IBT can be (1) a two-level transition system, (2) a three-level (or more) transition system with an intermediate state (or states), or (3) a three-or more level transition system that includes providing gain by pumping or the like. The energy states of these types of materials are shown in FIGS.

4 through 6. In all three types of material systems, $T_1$ is defined as the population decay time of the upper state, $T_2$ is defined as the coherence time of the upper to lower state transition, and $T_B$ is defined as the decay time of the intermediate or pumped state. In all the material systems, the radiation field of the programming and processing waveforms only couples states $|1\rangle$ and $|2\rangle$.

Figure 4:
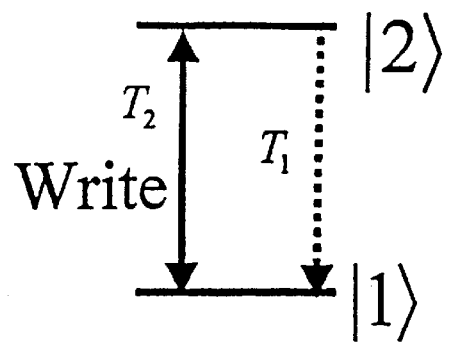
FIG. 4 is a diagram of a two-level transition system.

Referring to FIG. 4, in a two-level transition system, the radiation field is resonant with the two states $|1\rangle$ and $|2\rangle$. The upper to lower state transition has a lifetime $T_1=(\kappa_{21}^{-1})$, where, $\kappa_{21}^{-1}$, is the population relaxation time from state $|2\rangle$ to state $|1\rangle$.

Figure 5:
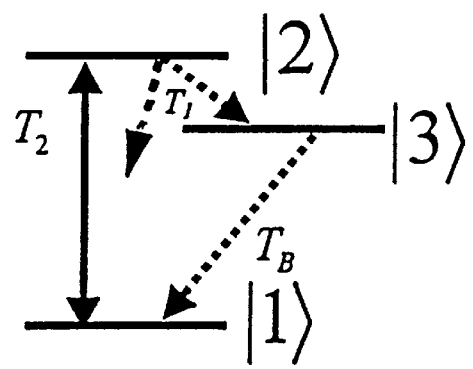
FIG. 5 is a diagram of a three-level system with an intermediate metastable state (or states) between a two-level transition.

Referring to FIG. 5, in a three-level transition system with an intermediate bottleneck state, the radiation field couples states $|1\rangle$ and $|2\rangle$ and there is an intermediate state $|3\rangle$. The inter-state transitions have population relaxation times $\kappa_{21}^{-1}$, $\kappa_{23}^{-1}$ and $\kappa_{31}^{-1}$. The state lifetimes are $T_1=(\kappa_{21}+\kappa_{23})^{-1}$ for the upper state and $T_B=\kappa_{31}^{-1}$ for the intermediate state. If $T_B \gg T_1$, this signifies a population bottleneck.

Figure 6A:
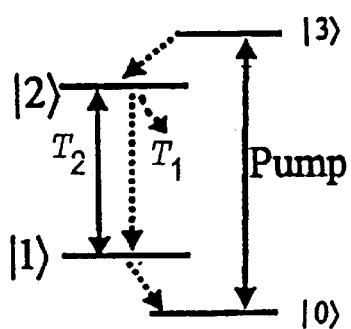
FIGS. 6A, 6B and 6C are diagrams of systems having three or more level systems that provide gain mechanisms to the accumulated grating used in other embodiments of the present invention.
Figure 6B:
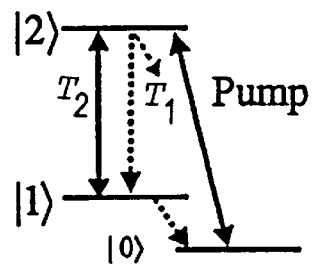
Figure 6C:
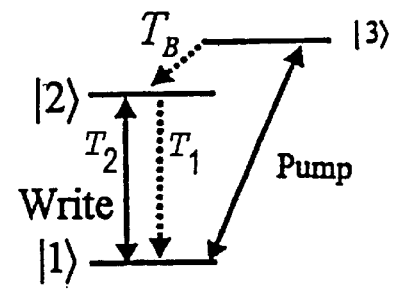

The technique is also possible in multi-level states such as those shown in FIGS. 6A, 6B and 6C. Typically these will involve a two-level transition with the possibility of levels above or below this transition. As in a two-level system, the radiation field of the programming and processing waveforms couples the states $|1\rangle$ and $|2\rangle$. The upper state $|2\rangle$ has a lifetime $T_1$ that is the inverse of the sum of the population relaxation rates from state $|2\rangle$ to all lower states. Several other multi-level systems could be used, and in these pumping could be employed between some of the states. Examples of these systems are illustrated in FIGS. 6A, 6B and 6C. A pumped four-level system such as is typical to laser media could be used, as is shown in FIG. 6A. Other examples of pumped three-level systems are shown in FIGS. 6B and 6C. The purpose of the pumping beam is to create a population inversion between states $|1\rangle$ and $|2\rangle$. For continuous or non-continuous pumping, the pumping rate is determined by the state population rates of the system. In all cases, the period between programming pulses, $\tau_R$, must be greater than the coherence decay time $T_2$, but less than the longest population decay time of any involved level of the system.

In any material system, the optical thickness or absorption length of the material is defined by its absorption coefficient times its length. In the choice of material for a continuously programmed device, the absorption length of the material in that device is not limited to optically thin materials. In most cases, the preferred absorption length is greater than one, for efficiency considerations, and could be substantially higher than one in order to optimize the efficiency of the device.

Timing Considerations

Certain conditions must be satisfied to obtain efficient processing. Consider the programming timing limitations with respect to a generalized three-level system where the radiation field only couples states $|1\rangle$ and $|2\rangle$ and there is an intermediate state $|3\rangle$ (or states), with population relaxation times $\kappa_{21}^{-1}$, $\kappa_{23}^{-1}$ and $\kappa_{31}^{-1}$ between the numbered states. This reduces to a two-level system if $\kappa_{23}=0$. The upper and intermediate state lifetimes are $T_1=(\kappa_{21}+\kappa_{23})^{-1}$ and $T_B=\kappa_{31}^{-1}$.

In general, the duration of programming pulse sequences $\delta\tau_{prog}$ is limited by the homogeneous dephasing time $T_2$. In the case of two programming pulses, this is the quantity $(\tau_{21}+\delta\tau_1+\delta\tau_2)$, where the inclusion of the pulse duration $\delta\tau_n$ of pulses 1 and 2 accounts for the general case when $\delta\tau_n \ll \tau_{21}$ is not satisfied. A similar relationship can be derived for the case of three or more programming pulses. Requiring $T_2 \geq 40\delta\tau_{prog}$ makes the fluctuations of efficiency due to coherent decay less than 10%, although techniques exist to compensate for these fluctuations. Setting $\tau_R \geq 2T_2$ avoids coherent interference between successive pairs of programming pulses. Setting $\tau_R$ much less than the greater of $T_1$ or $T_B$ insures that the repeated programming pulse pairs at the appropriate intensity form an accumulated grating, where after reaching steady state, their application exactly compensates for the relaxation losses during $\tau_R$. The relaxation losses during $\tau_R$ cause a fractional drop in the intensity of the output signal, $\epsilon$. For $\epsilon$ to be small, $\tau_R$ must be chosen appropriately.

Optical Source Stability

Beyond the population decay dynamics, the stability of the optical source is an important consideration. In practice, each repeated programming sequence may not be identical. For example, the stored grating from a single pair of two programming pulses, $G(\Omega) \propto E_1^*(\Omega)E_2(\Omega)e^{i(\Omega\tau_{21}+\phi_{21})}+$c.c., depends on the phase difference $\phi_{21}=\phi_2-\phi_1$ between the two pulses. This phase difference can fluctuate due to short-term frequency drift of the optical carrier. If the carrier frequency changes to $(\omega_0+\delta\omega_0)$, a change in the phase difference between the programming pulses of $\delta\omega_{21}=\delta\omega_0\tau_{21}$ will result. Consider any two programming pulse pairs, labeled the j-th and k-th pairs, that occur within a time shorter than $T_1$, or $T_B$ in a three-level system if $T_B>T_1$. If $\phi_{21}^{(k)}$ differs from $\phi_{21}^{(j)}$ by roughly $\pi$, then the pulse pairs contribution leads to incoherent accumulation of the grating and ineffective processing. The requirement exists, therefore, that $(\phi_{21}^{(k)}-\phi_{21}^{(j)}) \ll \pi$ for any and all combination of the j-th and k-th pairs, implying that the short term frequency stability of the laser must be better than $\delta\omega_0 \ll \pi/\delta\tau_{prog}$ over any time period within $T_1$, or $T_B$ in a three-level system if $T_B>T_1$. When the same optical source is used to create the programming and processing beams, its long-term frequency drift is inconsequential, provided all pulse bandwidths are well within $\delta\omega_1$. As the laser drifts, the previous grating decays and the new grating seamlessly accumulates when the above condition is maintained.

Advantages

A. Continuous Processing Simultaneous With Continuous Programming

The present invention proposes a method for achieving continuous processing with the benefit that the material does not need to exhibit long term persistent hole burning in order to achieve indefinitely continuous processing.

The present invention is superior to the prior state of the art. The prior art achieved continuous processing only for as long as the grating survived. In that scheme, the ultimate continuous processor would rely on a gating process, or mechanism to fix the grating permanently, to allow indefinitely continuous processing. In the present invention, the grating tries to decay to its equilibrium state, but since continuous programming is occurring, the grating is maintained and refreshed periodically. In this way, the grating can be utilized as long as the programming takes place, which can truly be indefinitely continuous. In this manner, the need for a gating process is eliminated whenever there is not a need for the grating to be permanently fixed, but only for the grating to remain relatively constant, which is true in this case, as the grating is constantly maintained.

B. Lower Intensity Programming Pulses.

Repetitive programming of the grating allows the grating to build up to its steady state value and then be maintained by each subsequent application of programming pulses. Subsequently, the intensity of each of the programming pulses is significantly lower than those that are required for single shot programming of a grating.

C. High Efficiency Gratings.

An efficiency analysis for a generalized three-level system is presented, which is applicable to two-level systems as well. This analysis applies to an OCT TTD regenerator programmed with BRPs as well as with frequency chirped reference pulses. The analysis follows from the treatment of accumulated gratings where the steady state population solutions are derived for a three-level system where the medium is optically thin. Analysis can be performed for optically thick media as well, where the efficiency of the grating for an optically thick media can be higher than for optically thin media. Such an analysis also exists for the generalized case of programming a pattern waveform or other waveforms into a spectral grating. Simulation results presented later show these relationships.

Assuming a stable optical source, a continuously programmed continuous processor has the ability to produce a highly efficient grating. For an absorber at frequency $\omega$, the steady-state spectral population difference between the excited and ground states is $$w(\Delta) = \qquad (1)$$
$$(1-p)\frac{e^{-x_1}(1-e^{-x_B}) + \beta(e^{-x_B} - e^{-x_1})/2}{1 - e^{-x_B} - pe^{-x_1}(1 - e^{-x_B}) + \beta(1-p)(e^{-x_B} - e^{-x_1})/2} - 1,$$

where $\Delta=\omega-\omega_0$, $\beta=\kappa_{23}/(\kappa_{23}+\kappa_{21}-\kappa_{31})$, $\chi_B=\tau_R/T_B$, $\chi_1=\tau_R/T_1$, and $p=1-2\theta^2 \cos^2(\Delta\tau_{21}/2+\phi_{21})$ assuming that $\theta_1=\theta_2=\theta$, where $\theta_n$ is the area of pulse n, $\theta \leq 0.1\pi$ and $\tau_{21} \ll T_2$. Equation (2) reduces to the two-level case when $\beta=0$.

A qualitative estimate of the intensity of the true-time delay output signal is the magnitude squared of the inverse Fourier Transform of Eq. (1), evaluated at $\tau_{21}$. For reference, the efficiency is normalized against that of a photon-gated two-level persistent holeburning system with gating efficiency, $\gamma_{gate}$, equal to one. In general, given fixed values for $T_1$, $T_B$ and $\beta$, the efficiency can be optimized to $\eta_{opt}$ for any given $\tau_R$ by varying $\theta$ to a value $\theta_{opt}$. Increasing $\tau_R$ increases both $\theta_{opt}$ and $\epsilon$. It is found that $\eta_{opt}$ is identical for all $\tau_R$ and $\eta_{opt}=0.47$. Thus, non-persistent materials can have efficiencies higher than a photon-gated material with $\gamma_{gate}<0.68$, since the output intensities of gated systems go as $\gamma_{gate}^2$. Currently available gated materials have $\gamma_{gate} \ll 1$, so in comparison to these, the efficiency of a continuously programmed grating is several orders of magnitude greater. For $T_B \gg T_1$, the efficiency is due almost entirely to the first harmonic of the accumulated grating in the ground state, not the upper state. For $\beta=0$ or for $T_B \ll T_1$, both ground and upper state population gratings contribute to the efficiency.

When pulse 1 or 2 is a TSW, optimizing the efficiency must be balanced with minimizing distortions from the stored TSW grating. This need to minimize non-linearities that lead to signal distortion may lead to lower efficiencies for continuously programmed memories and processors, but results for a particular code show efficiencies that are as high or higher than for a true-time delay grating.

D. Removal of Non-linearities.

The preferred input beam geometries have the benefit that non-linearities introduced by the multiple programming stages do not lead to harmonics of the delay in the output signal direction in, at least, the case of TTD regenerators.

E. Reprogrammability and Adaptability.

Although a particular grating has been accumulated in the IBT material, this grating is not permanently stored in that IBT. In fact, new delays or patterns can be reprogrammed into the material, with a reprogramming time roughly equal to $T_1$, or $T_B$ in a three-level system when $T_B > T_1$. In this case, the old grating decays away and the new grating seamlessly forms. This adaptation to new patterns also allows the processor to adapt to the correlated frequency drift of the laser source(s) used for the programming and processing pulses. As long as the optical carrier frequency of the programming and processing pulses drift together, the medium will adapt to the new carrier frequency with the grating lifetime. For slow drifts, this adaptation takes place seamlessly. The accumulation and adaptability features can combine to allow for adaptive learning of unknown patterns from remote signals. Such adaptive learning is useful in the analysis of patterns in communications or neural messages and in adaptive beamforming and jammer nulling for phase array radar.

Other methods may be used to reprogram the grating faster than in a time $T_1$, or $T_B$ in a three-level system when $T_B > T_1$.

The simulations described below assume quick writing in the case where no grating previously existed in the medium. It should be possible to quickly reprogram a medium that was previously programmed in a time much less than the relaxation time of the grating. One embodiment of this quick reprogramming has two sets of programming pulses act one after the other on the medium, but probably not closer in time than the coherence lifetime of the IBT. The first such set of programming pulses acts to null out the current grating by writing a grating that is the spectral opposite of the current grating, resulting in a spectrally flat absorption spectrum. The medium at this point would not be in its ground state, but in a state of uniform excitation across the absorption spectrum. The second set of programming pulses acts to create a new grating close to that which is desired and that which can be refreshed by subsequent programming pulses of. lower amplitude. The flat part of the excitation spectrum would slowly relax to its steady state level in the relaxation time at the same time the new grating is being refreshed. A useful grating is thus produced before the old grating has decayed away.

F. Angular Demultiplexing and Multiplexing.

The information gratings stored in a single spatial location can be angularly demultiplexed or multiplexed by changing the angle of the input beam for the first or second programming pulse, respectively, while still maintaining the phase matching conditions.

Currently Available Materials

Several materials are currently available that can be used in a continuously programmed continuous processor system. Consider two non-persistent material systems that are currently available and at wavelengths compatible with commercially available diode lasers. For a three-level system, $Tm^{3+}$:YAG (0.1 at. %) offers an intennediate bottleneck level between the two-level IBT at 793 nm. At 4.4 K, $\delta\omega_1 \sim 17$ GHz, $T_2 \sim 16$ $\mu$s, $T_1 \sim 800$ $\mu$s, $T_B \sim 9$ ms, and $\beta \sim 0.59$. Setting $\tau_R = 32$ $\mu$s yields $\theta_{opt} = 0.05\pi$ and $\epsilon = 2.0\%$. Delays up to 0.4 $\mu$s are feasible without any compensation for efficiency fluctuations, provided the laser frequency is stable to 250 kHz over 9 ms. For a two-level system, $Er^{3+}$:LiNbO$_3$ (0.06 at. %) has a IBT at 1.53 $\mu$m. At 1.6 K, $\delta\omega_1 \sim 200$ GHz, $T_1 \sim 10$ ms ($\beta=0$), and $T_2 \sim 40$ $\mu$s in a 3 kG external magnetic field. Setting $\tau_R = 80$ $\mu$s yields $\theta_{opt} = 0.045\pi$ and $\epsilon = 1.6\%$. Delays up to 1.0 $\mu$s are feasible for a laser stable to 100 kHz over 10 ms. For both cases, the efficiencies are still better than a gated material with $\gamma_{gate} < 0.68$. This analysis and predicted efficiencies are valid for the OCT true-time delay regenerator programmed with BRP's as well as with frequency chirped reference pulses.

Simulations

Simulations were performed to see the buildup dynamics of the grating over time by integrating optical Bloch equations for an optically thin sample. For the simulations, a two level system was modeled, using a material parameter of $T_1 \sim 10$ ms, $T_2 \sim 40$ µs setting $\tau_R = 80$ µs. In these simulations, the programming pulse pairs were repeated for a variable number of times, with a complete loss of coherence between programming pulse pairs. After the programming sequence, the grating was probed with a weak brief pulse to observe the intensity of the emitted stimulated echo signal at the appropriate time. This is done by integrating the pulse effects in the frequency domain, both for programming and probing of the grating, and then performing a fast-Fourier Transform. This result, squared, gives the intensity of the emitted signal in the time domain.

Figure 7A:
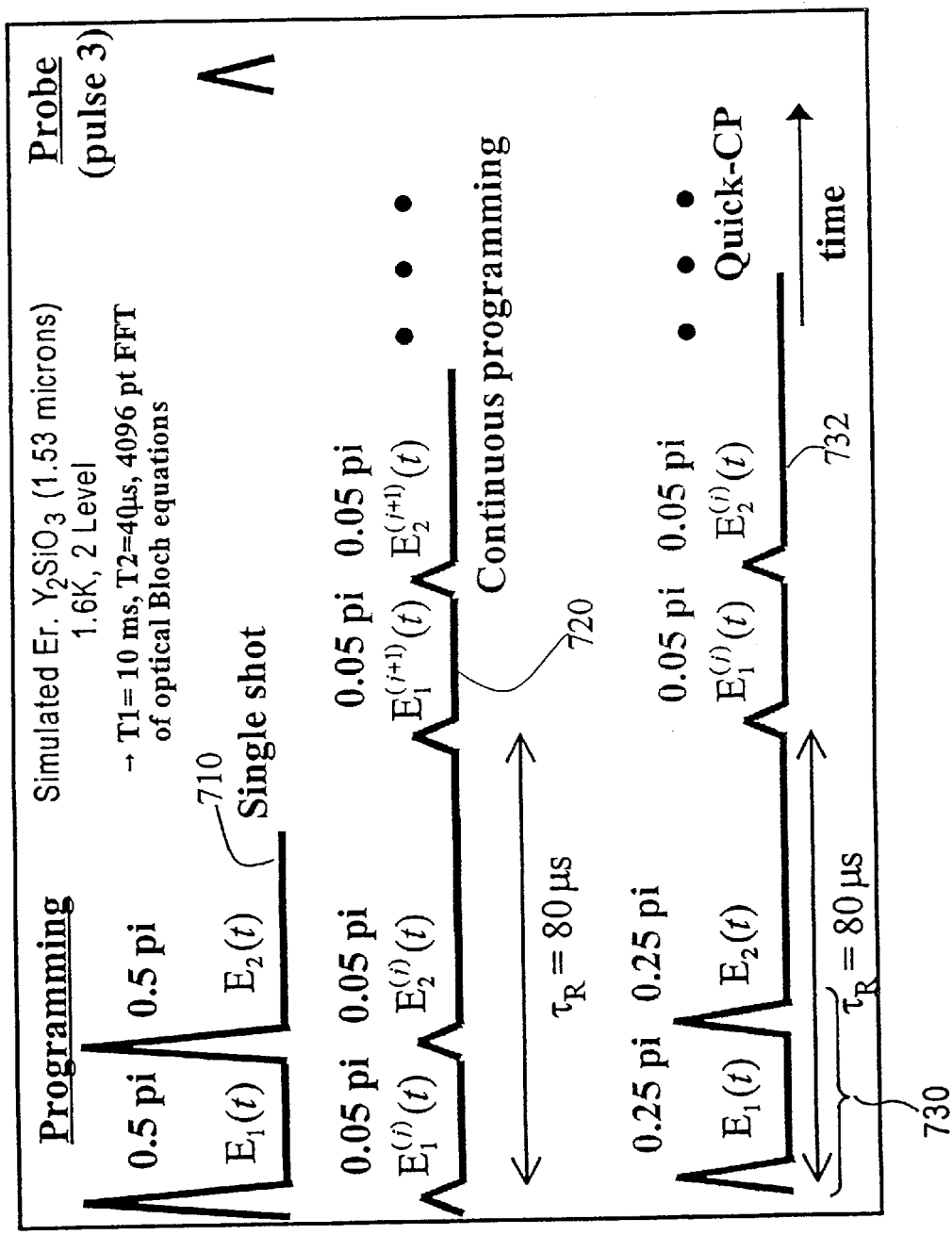
FIG. 7A is a time line graph showing the programming pulses used for simulation purposes for true time delay storage according to several embodiments of the present invention.
Figure 7B:
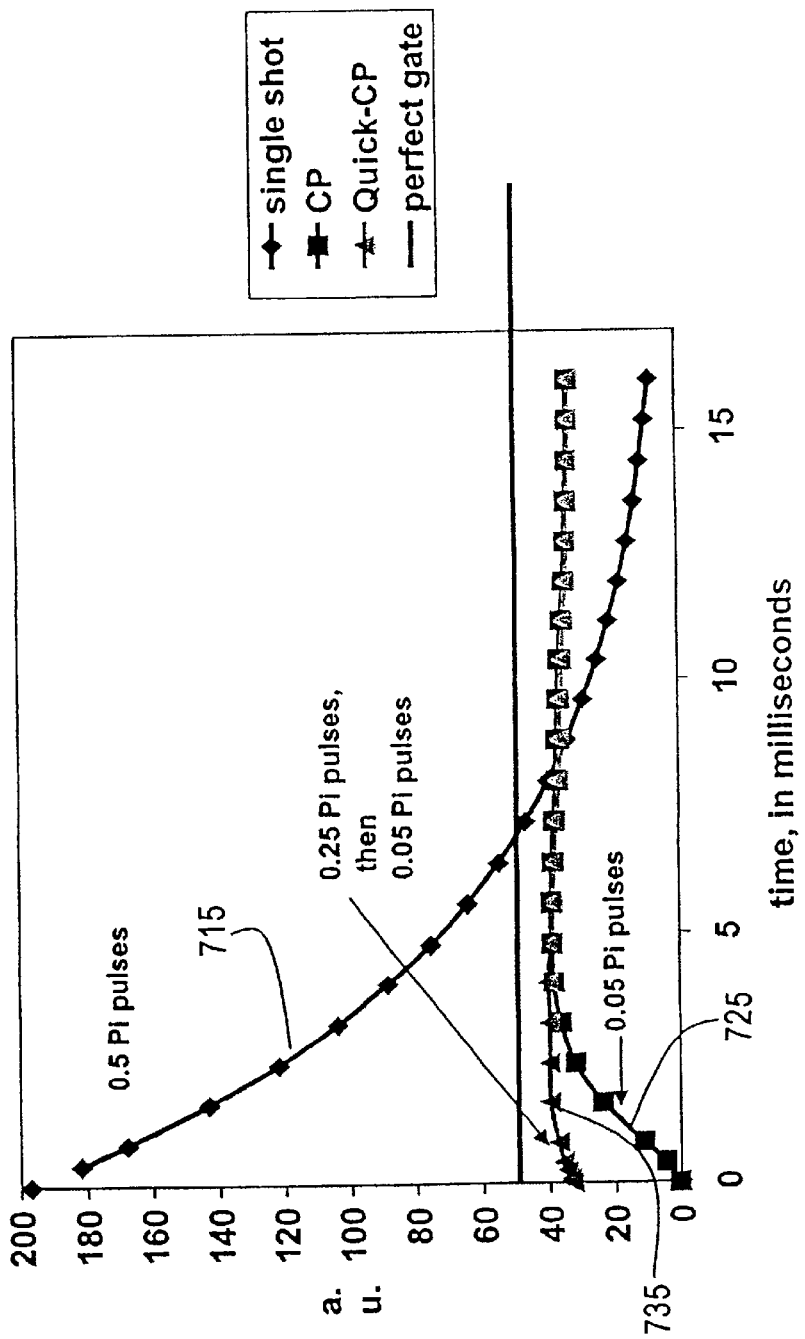
FIG. 7B is a graph of output signal intensity showing simulated output signals for true time delay from several embodiments of the present invention.

FIG. 7 shows the optimized input sequences and results for the simulations. First, a strong grating was written with a single shot programming of two brief reference pulses 710 (FIG. 7A), each of pulse area $0.5\pi$, giving a signal strength intensity 715 (FIG. 7B) when probed 80 µs after writing, which then decays as $\exp(-2t/T1)$ with a grating lifetime $T_1 = 10$ ms. Next, a repeated sequence of pulse pairs 720 (FIG. 7A), each with the same pulse area, equal to $0.05\pi$, are applied a variable number of times, and probed to measure the grating strength 725 (FIG. 7B). The results for continuous programming (CP) build up to a strength slightly higher than the steady state value in about 3 ms, and then slowly approach the steady state value. For this simulation out to ~15 ms, the grating strength is 0.66 of the perfect photon-gated system. This value should converge on the analytic solution result of 0.47 of the perfect photon-gated system after several times $T_1$.

Next, the alternative technique of quick programming of the grating (Quick-CP) was simulated, for the case when a steady state grating is needed, but needs to written quickly, rather than waiting ~3 ms for a strength near that of the steady state. First, the strength of the grating was taken immediately to the level of the steady state solution for continuous programming, by using a single pair of programming pulses 730 (FIG. 7A) that were higher in intensity than those for continuous programming. These pulses were found to be near optimal for areas of $0.25\pi$, a factor of 5 higher in pulse area, or a factor of 25 higher in intensity than those needed for continuous programming. Then, the process of continuous programming was used with the same pulse areas $(0.05 \pi)$ 732 (FIG. 7A) as for the previous case, to maintain that grating. In this case, we find that the grating intensity 735 (FIG. 7B) converges on the same steady state solution as the previous case. Therefore, by amplification of one pair of programming pulses, in this case, by a factor of 25 in intensity, the grating can be written quickly (within the desired time delay $\tau_{21}$) and then maintained by low intensity programming pulses.

Several other simulations were performed to see if the grating could be maintained at higher levels. The result of this work was that gratings converges to the steady state solution as shown in FIG. 7, regardless of the strength of the initial grating.

In summary for true time delay programming, a grating can be accumulated and maintained in steady state with very low intensity programming pulses, gaining a factor of 100 reduction in pulse intensity as compared to the single shot programming, that produces a highly efficient grating whose strength is on the order of 50% of the perfect photon-gated system. This grating can be accumulated slowly (~3 ms) or can be written immediately by pulses that have 25 times the intensity of the accumulating pulses, and then maintained in steady state.

For signal processors, and memories, the stored grating represents the interference of a pattern pulse and reference pulse, where the pattern is of variable length and pulse area, typically lower than the area of the reference pulse, so that no analytical solution is readily available. Therefore, simulations of single shot and repeated programming of a pattern waveform were performed to see the buildup dynamics of the grating over time, again by integrating the optical Bloch equations for a thin sample. Again, the system was modeled as two-level system for $T_1 \sim 10$ ms, $T_2 \sim 40$ µs and $\tau_R = 80$ µs. In these simulations, the programming pulse pairs consisted of a pattern waveform and a brief reference pulse with the same duration as each bit in the pattern. These two pulse were repeated for a variable number of times, with a complete loss of coherence between programming pulse pairs. After the sequence, the grating was probed with a weak pattern pulse, either the same code or a different code. When the code is the same, it will produce an auto-correlation peak, and a measure of this peak and its maximum side lobe level serves as a measure of the strength of the grating by the intensity of the emitted optical coherent transient at the appropriate time. This is done by integrating the pulse effects in the frequency domain, and then performing a fast-Fourier Transform and squaring the result to yield a solution for the intensity of the emitted signal in the time domain.

Figure 8A:
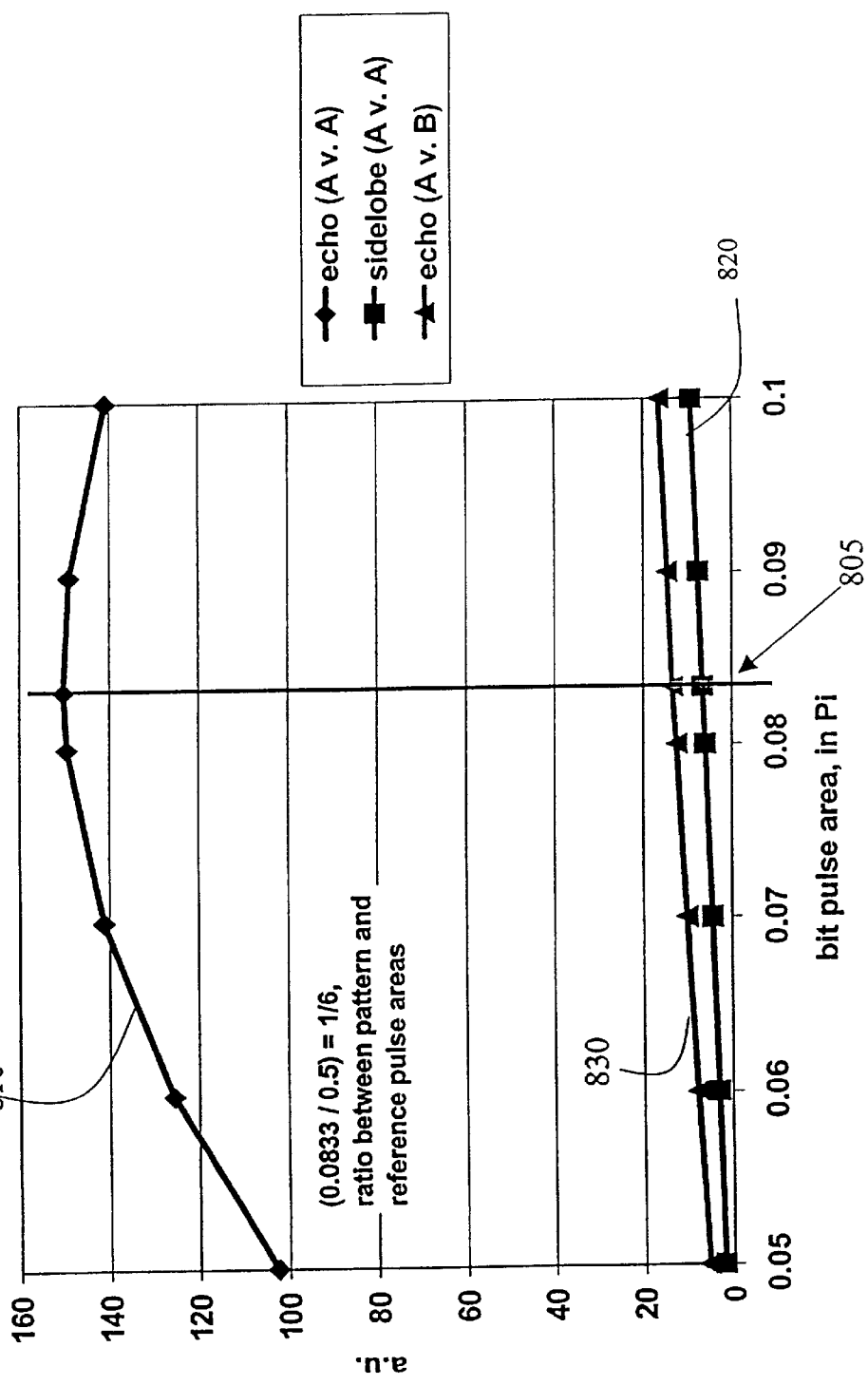
FIG. 8A is a graph showing the simulated strength of a single shot correlation as a function of pulse area for purposes of simulations of continuous programming of a pattern waveform in accordance with one embodiment of the present invention.

First, as shown in FIG. 8A single shot programming of a particular pattern was performed to see the optimal strength of the output signal as a function of the pulse area of the pattern bits, when interfering it with a brief reference pulse of area 0.5 $\pi$. For this simulation, the pattern pulse was chosen to be one of two 30-bit spread spectrum codes, denoted here as code A and code B, which were modulated in a bi-phase, return-to-zero format. These codes are advantageous in that the auto-correlation of a code with itself (A v. A) produces a strong peak with low sidelobes 820, while the cross-correlation 830 of the two codes (A v. B) produces no peak and low noise levels. The probe pulse (i.e. pulse 3, or data pulse) was kept at a very low intensity, and probed the grating 80 µs after the last writing process was completed.

Figure 8B:
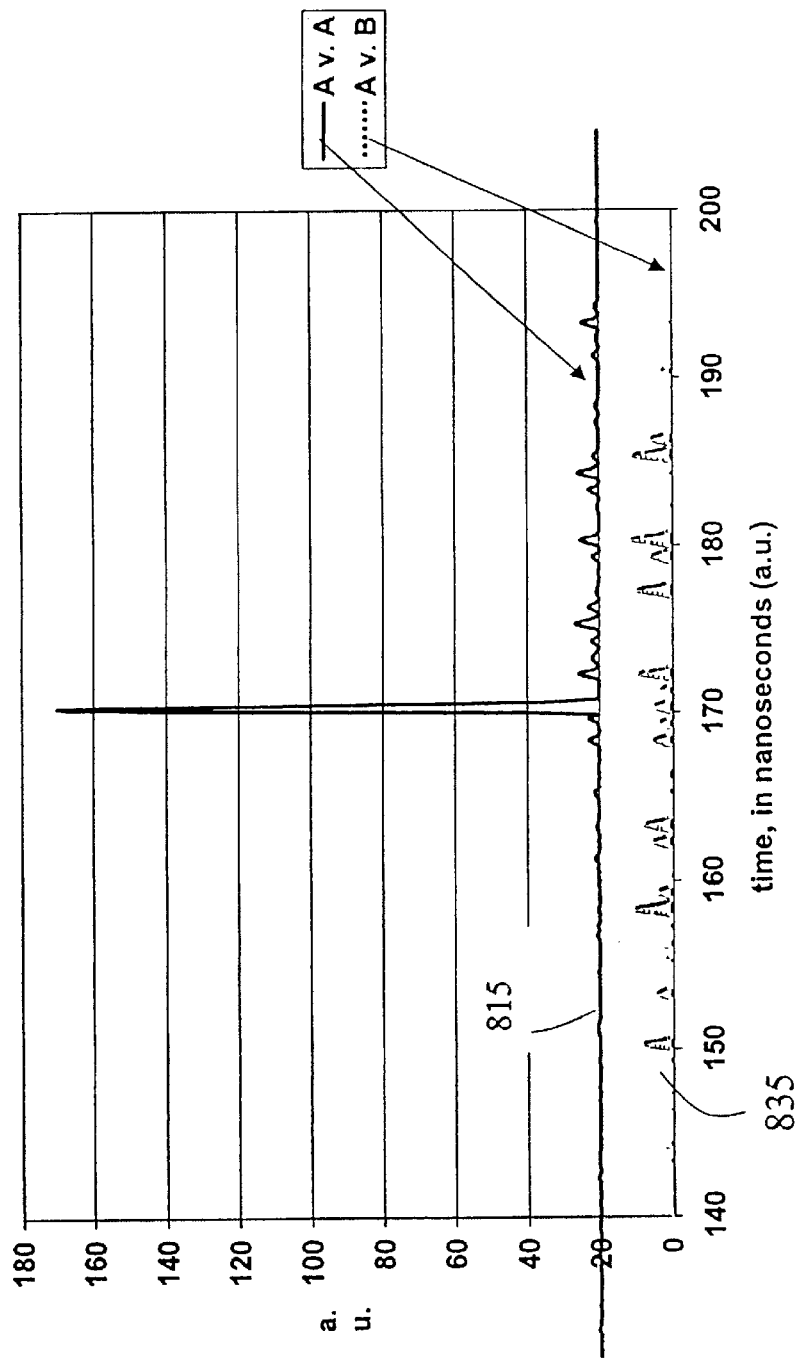
FIG. 8B is a graph of the simulated output signals of a single shot pattern storage and correlation processing for purposes of simulations of continuous programming of a pattern waveform in accordance with one embodiment of the current invention.

FIG. 8A (left) shows the optimization for pulse area by programming the pattern, in this case, code A, by interfering it with a brief reference pulse of area 0.5 $\pi$. By varying the pulse area used for each of the individual bits of the pattern pulse, the optimal intensity output signal 810 when probed with code A was obtained at an area 805 of $0.0833\pi$, above which the grating is saturated. This measure established a 1:6 ratio between the pattern pulse area and the reference pulse, which was then used for the continuous programming case. FIG. 8B shows the actual output signal 815 of the auto-correlation of code A for the area of $0.08337\pi$ of the pattern bits, with its associated sidelobe level, and the cross-correlation signal 835, in this case, of code A v. code B, indicating that the noise level of the cross correlations dominated the sidelobe level of the auto-correlation peaks.

Figure 9A:
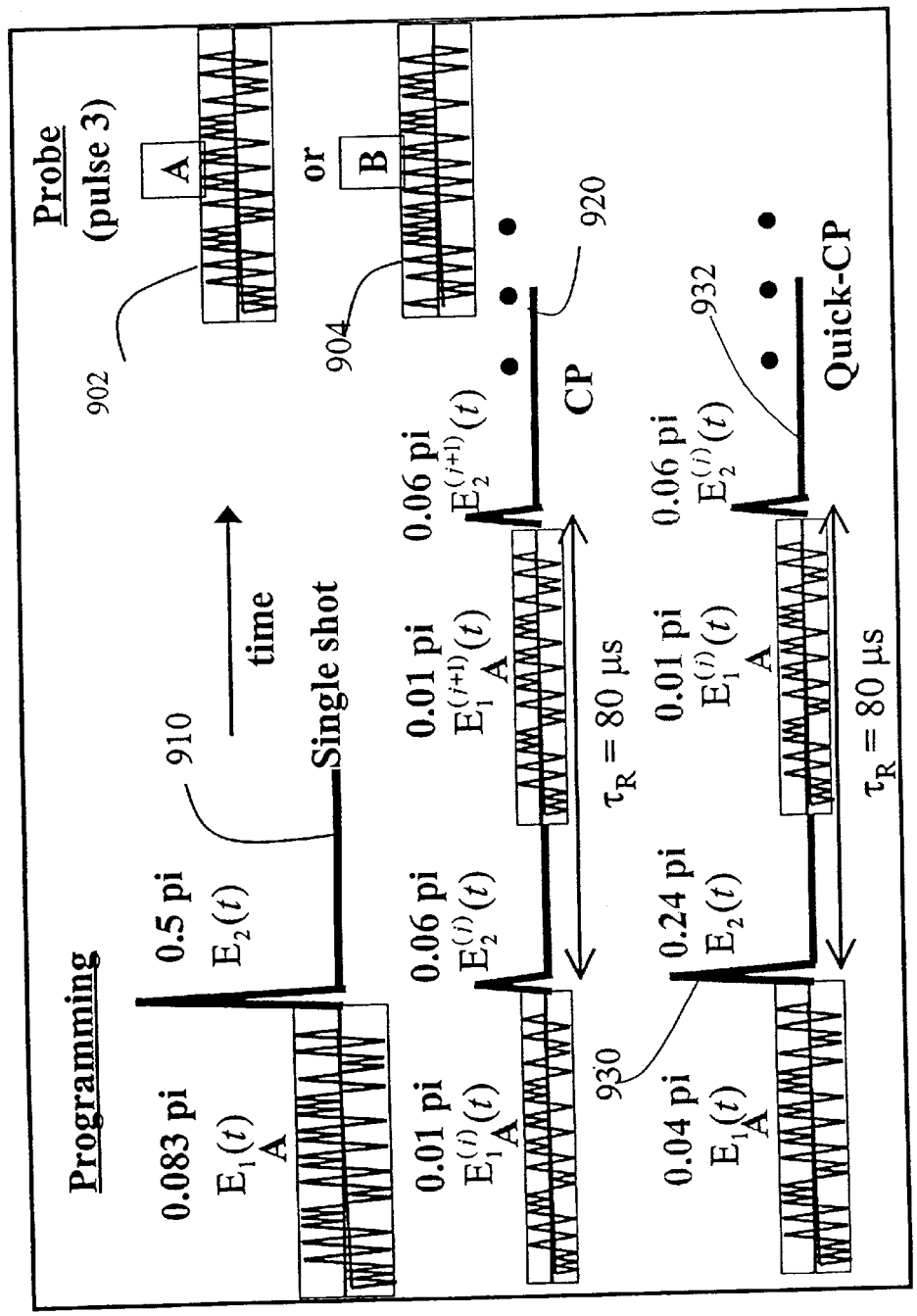
FIG. 9A is a time line diagram showing the programming pulses used for simulation purposes of pattern storage according to several embodiments of the present invention.
Figure 9B:
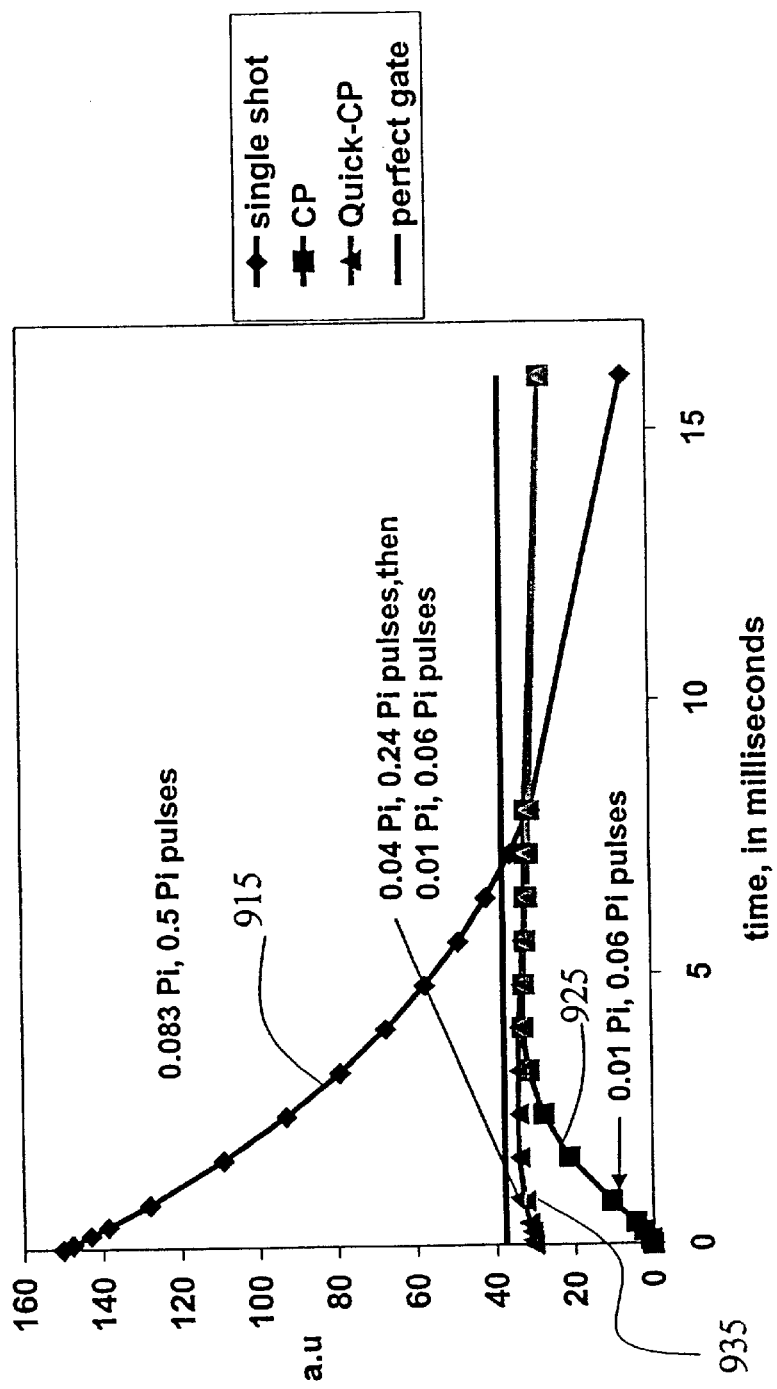
FIG. 9B is a graph of output intensity showing simulated output signals for correlation signal processing from several other embodiments of the present invention.

FIG. 9 shows the optimized input sequences and results for the simulations for continuous programming of pattern waveform. First, a strong grating was written with a single shot programming of the pattern pulse and brief reference pulse 910, as shown in FIG. 9A, with areas of 0.0833π and 0.5 π, respectively, and its intensity 915 (FIG. 9B) exponentially decays away with a grating lifetime $T_1$=10 ms. Next, a repeated sequence of pulse pairs, optimized in this case by maintaining the 1:6 ratio and establishing pulse areas of 0.01π and 0.06π for the pattern and brief reference pulse, respectively, accumulate and maintain a grating with intensity 925 seen to evolve over time for a variable number of repeat cycles out past 15 ms. Encouragingly, for this code, the results for continuous programming (CP) show similar results to those for the true time delay grating, in that the grating accumulates to a level slightly higher than the steady state value in about 4 ms, and then slowly approaches a steady state value. For this simulation, out to ~15 ms, the grating strength is 0.73 of the perfect photon-gated system.

Next, an alternative technique of quick programming of the grating was explored for pattern storage. The strength of the grating 935 (FIG. 9B) was taken immediately to the level of the steady state solution for continuous programming, by using a single pair of programming pulses 930 (FIG. 9A) that were higher in intensity than those for continuous programming. These pulses were found to be near optimal for areas of 0.04π and 0.24π for the pattern and brief reference pulse, respectively, maintaining the ratio 1:6 and increasing by a factor of 4 in pulse area, or a factor of 16 in intensity over the continuous programming case. Then, the process of continuous programming 932 (FIG. 9A) was used with the same pulse areas (0.01π, 0.06π) as for the previous case to maintain that grating. The solution shows that the grating is quickly written and converges on the same solution as the previous case. Thus, amplification by a factor of 16 intensity for the first shot of programming can achieve a quickly written grating (within the desired time delay $\tau_{21}$) and then maintained by low intensity programming pulses. Other simulation results show the grating to converge to this steady state solution, regardless of the strength of the initial programming pulses.

In summary, these simulations show that for a particular set of codes, the method of continuous programming of a grating representing a pattern waveform can lead to a highly efficient grating that can be used for continuous processing. The grating can be accumulated slowly (~3 ms) by very weak programming pulses or written quickly by an initial pair of more intense programming pulses.

Experimental Example

Figure 10A:
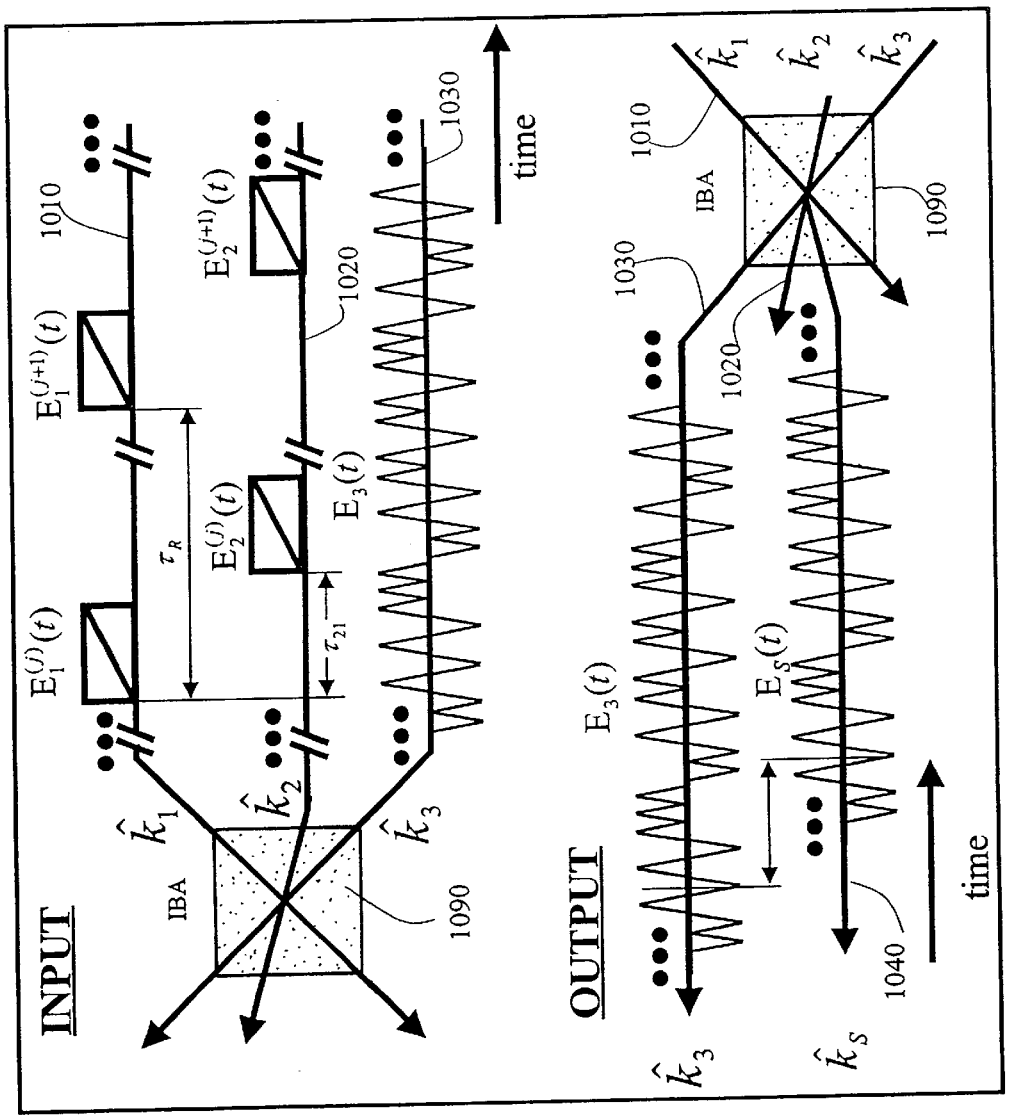
FIG. 10A is a diagram of programming pulses and input and output signals according to another embodiment on the present invention.
Figure 10B:
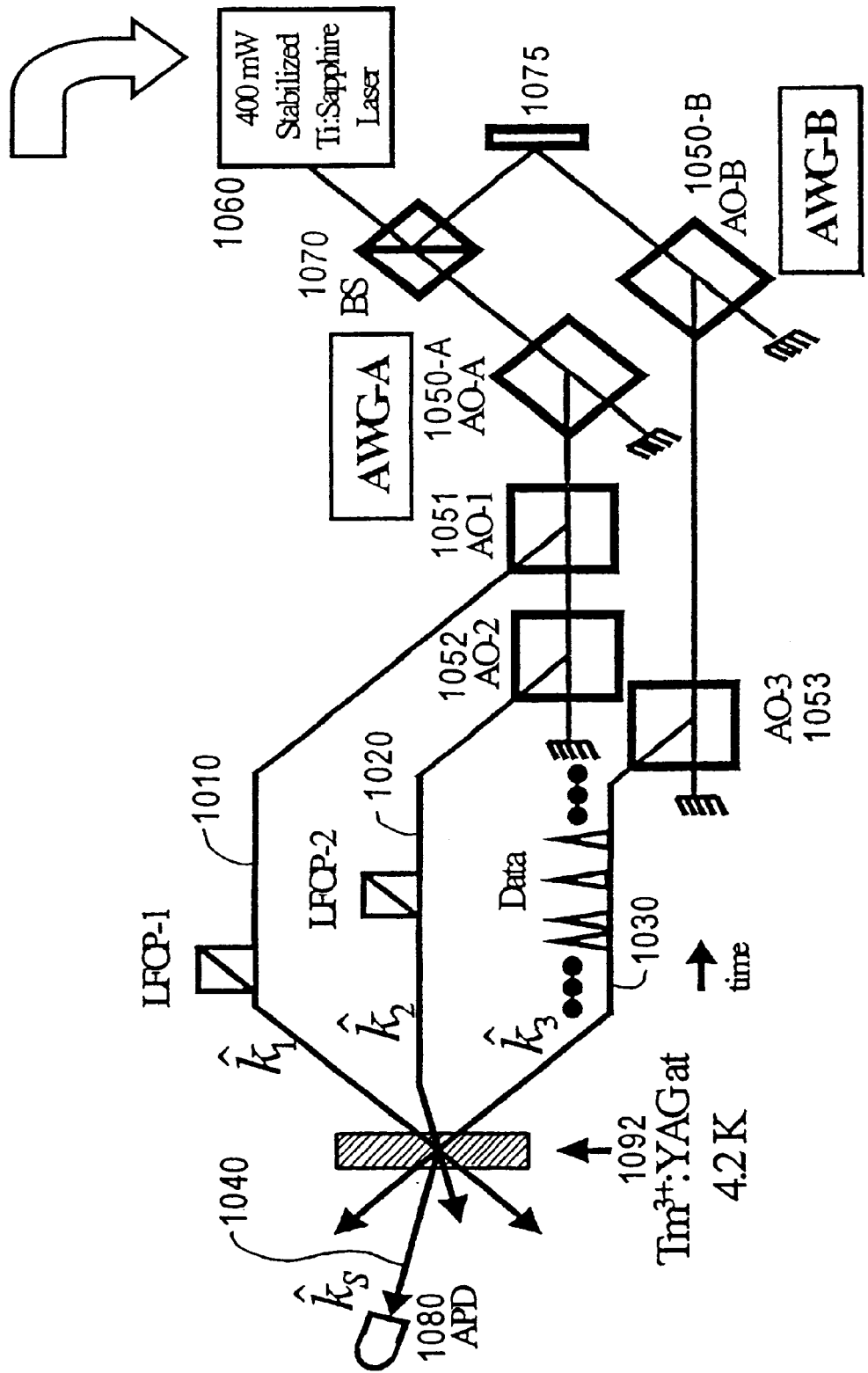
FIG. 10B is a block diagram of an optical experimental setup for another embodiment of the present invention.

True-time delay of a continuous signal was experimentally demonstrated in a 5.5 mm long $Tm^{3+}$:YAG crystal (0.1 at. %) on the $^3H_4 \rightarrow ^3H_6$ transition at 793 nm, maintained at 5 K in a continuous flow liquid helium cryostat. FIG. 10 shows the input pulse sequence used and the optical experimental setup. The resonant cw-output of an Argon-pumped Ti:Sapphire laser 1060 with external stabilization to reference cavity, was split into two paths via a variable beamsplitter 1070. On each path was an initial acousto-optic (AO) modulator 1050, noted as AO-A and AO-B, that created optical pulses. Both of these devices had a center frequency of 125 MHz with a bandwidth of 40 MHz. For each AO-A and AO-B, an independent arbitrary waveform generator created the input RF signal to their respective drivers, enabling full control of the amplitude, frequency, and phase of the optical waveforms they created. The AO-A created each of the linear frequency chirped pulses (LFCP's), while AO-B created the TSW data stream (pulse three) 1051 and 1052. The resultant pulse sequence from AO-A was then directed to a series of two identical AO modulators at a center frequency of 80 MHz with a bandwidth of 15 MHz. Pulse one was deflected by one of these devices 1051 onto first beam 1010, and pulse two was deflected by the other 1052 onto second beam 1020. The output from 1050-B (pulse 3) was deflected by a third 80 MHz device, 1053, creating a pulse on third beam 1030 at the same center frequency with the pulses on first and second beams 1010, 1020. Each of first, second and third beams 1010, 1020, 1030 have wavevectors $\hat{k}_1$, $\hat{k}_2$, $\hat{k}_3$, respectively, and were directed in the configuration of FIG. 2A and overlapped in an 200 $\mu$m spot ($1/e^2$ diameter) in the crystal. After the cryostat, the output signal 1040 was incident onto an 800 MHz avalanche PIN photodetector 1080. No deflection systems or spatial filters were used to isolate the output from the inputs. The emitted output waveforms were captured on a 1.0 GHz digitizing oscilloscope.

Figure 11:
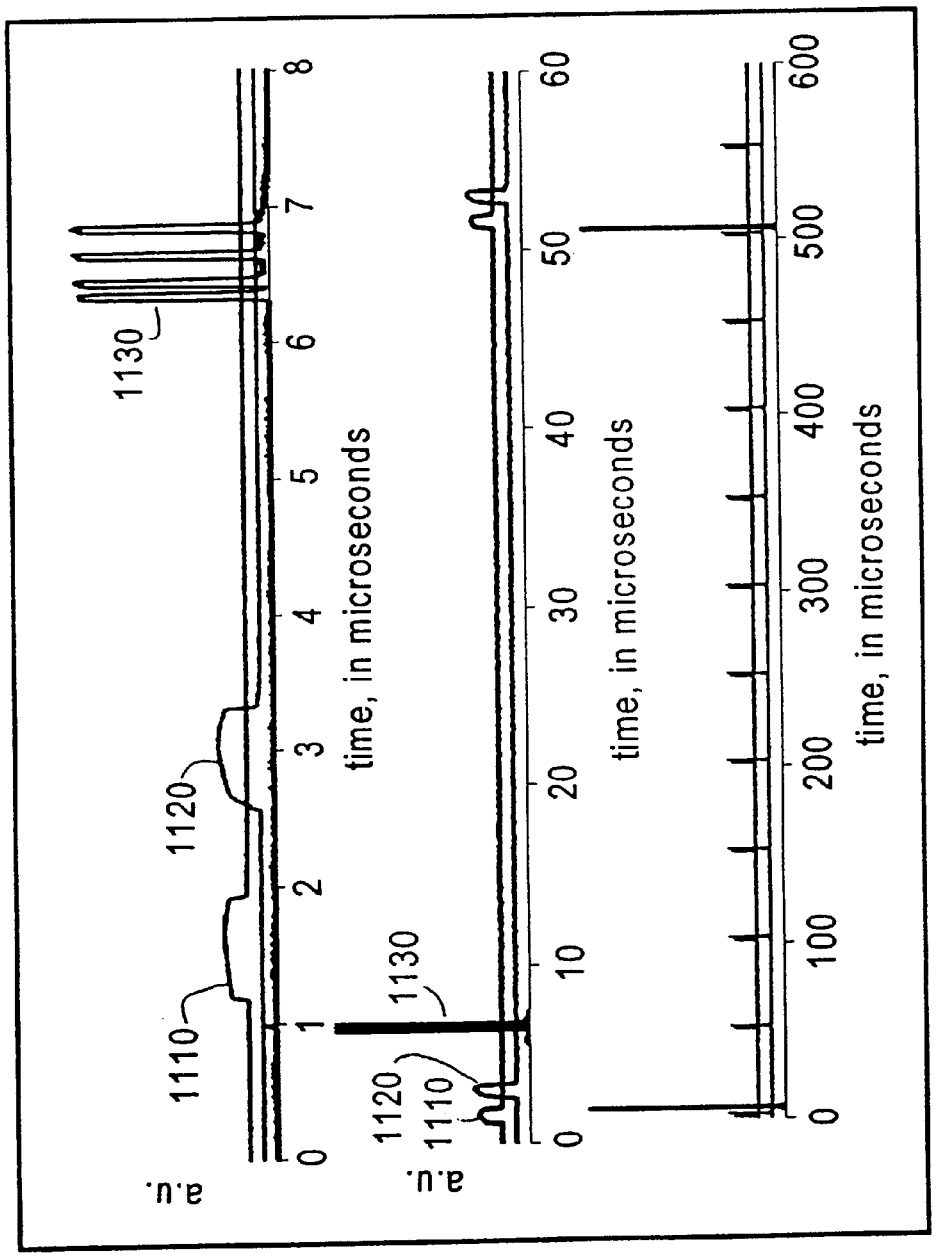
FIG. 11 is a time line plot comparing the input signal and programming pulses on three time scales according to the embodiment of the FIG. 10.

Chirped pulses were used for continuous programming, in order to demonstrate their effective replacement of brief pulses for true time delay programming. FIG. 11 shows the intensity profiles of the input waveforms as captured before the crystal on a photodetector, in three different time scales. In each time scale, the top trace 1110 is the first chirp, the middle trace 1120 is the second chirp, and the bottom trace 1130 is the data waveform acting as pulse 3. Each of these LFCP had duration $\tau_C$=750 ns, chirp bandwidth $\delta\nu_C$=30 MHz, and an average power of 0.4 mW. The amplitude variations between the two LFCP's are due to the responses of the modulators. The TSW data code was a nine bit binary bit sequence (1,0,1,0,0,1,0,0,1) where for each "1" the optical power was on and "0" the optical power was off. Each bit was 50 ns in duration, so that the data bandwidth $\delta\nu_D$ was 20 MHz, and each bit had a power level of 20 mW. Also, each alternating "1" bit was shifted in phase by π radians to reduce saturation effects.

Figure 12A:
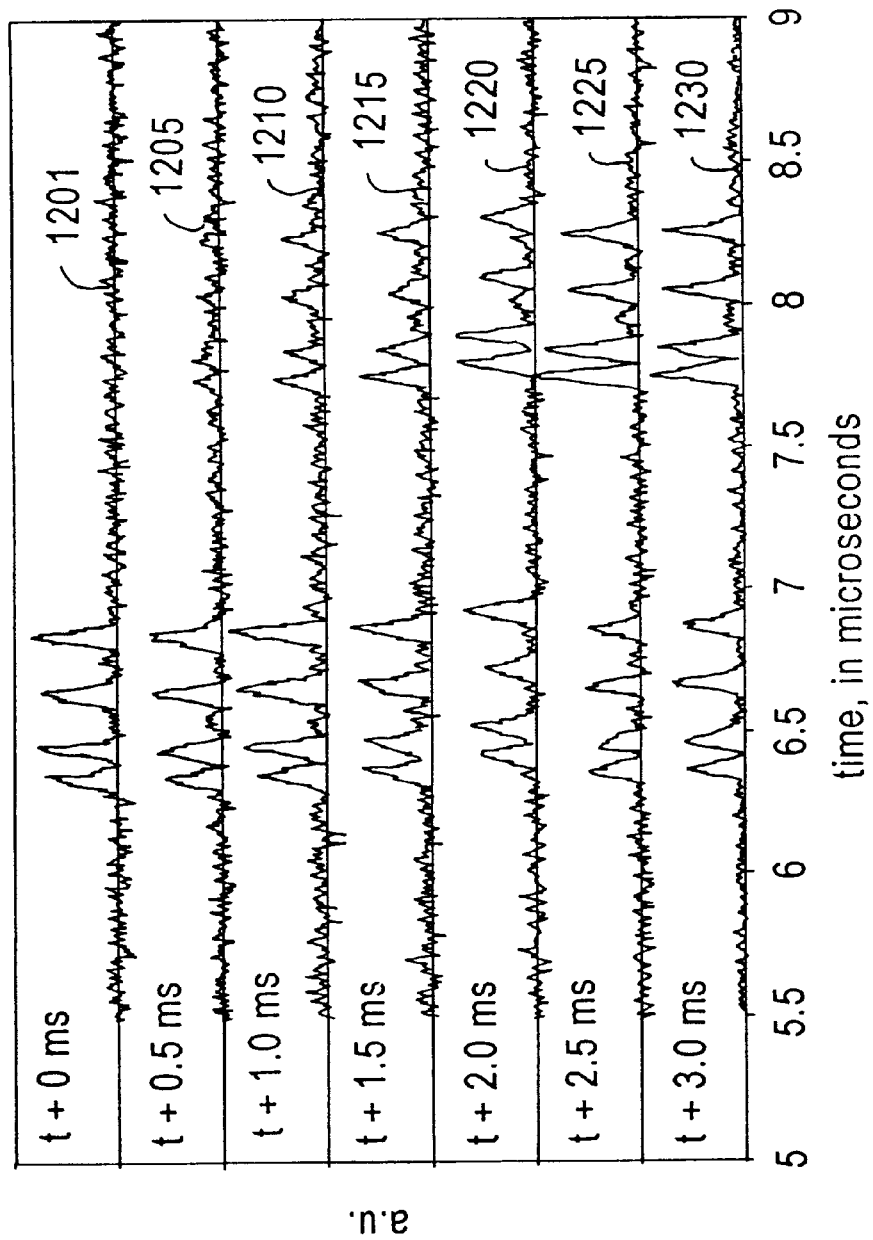
FIGS. 12A and 12B are time line graphs of output signals according to the embodiment of FIG. 11.
Figure 12B:
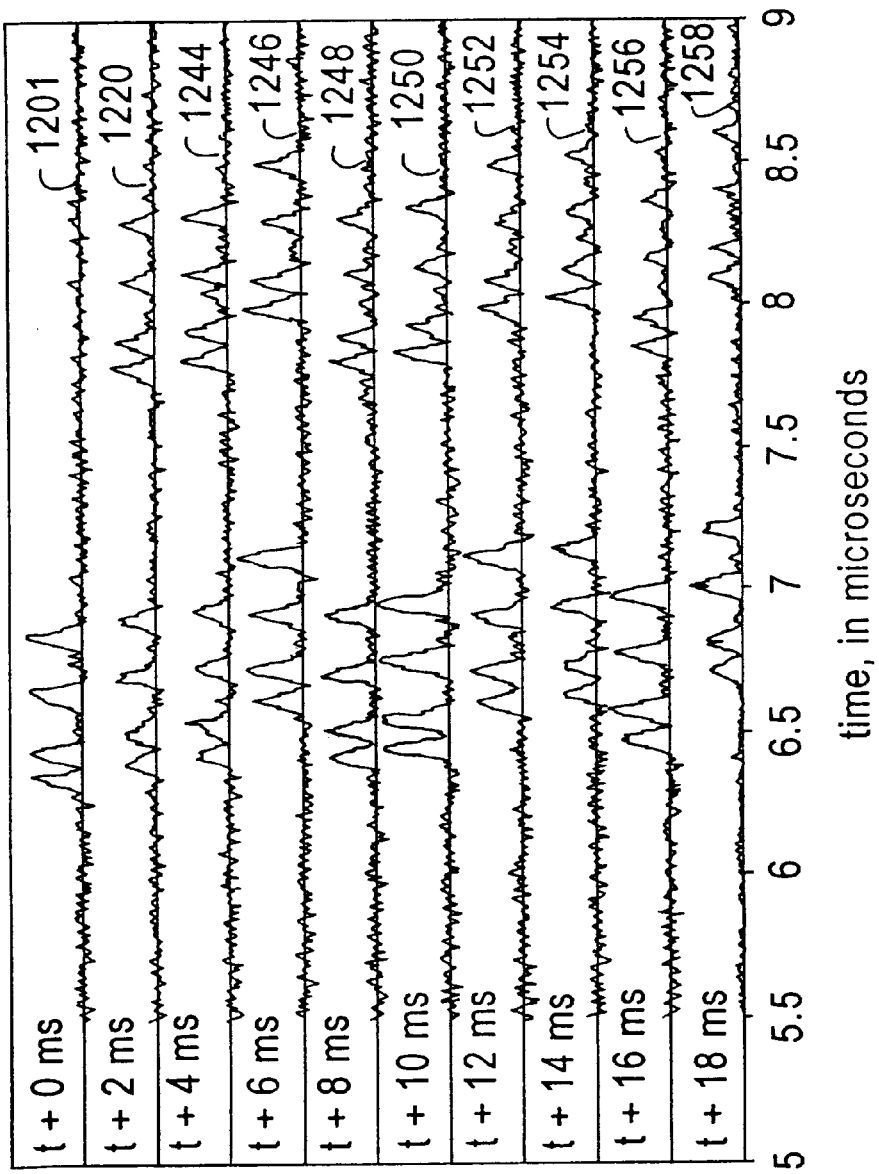

FIG. 12 shows the output signals as captured on the digitizing oscilloscope for these input pulses. For both plots in FIG. 12, on each trace there is evidence of the probe data pulse (on the left) that is intentionally scattered along the direction of the emitted output signal, serving as a reference for the time delayed version of that probe pulse (on the right) on each trace. For FIG. 12A, the probe pulse was introduced into the grating every 500 microseconds to see the evolution of the grating to steady state. For this experiment to be possible, the carrier frequency of the Ti:Sapphire laser was locked to a reference cavity using the Pound-Drever-Hall technique and was stable to an estimated value of 250 kHz over 10 ms. However, external factors in the laboratory made this locking unstable, so that the captured data traces represent the best performance possible under these conditions. Traces that showed signs of frequency instability were discarded. The maximum power level of the desired signal is ~7 $\mu$W, representing an efficiency of 0.04% as compared to the probe pulse. This efficiency is quite low and was not obtained in ideal conditions, but for proof-of-concept purposes only. In FIG. 12A, the grating can be seen to evolve to roughly a steady state in 3.0 milliseconds. In FIG. 12B, the same probe pulse was introduced every 2 milliseconds, showing that the grating is in a steady state for a time that exceeds the persistence time of the material (~10 milliseconds).

In summary, an optical coherent transient true-time delay device was experimentally demonstrated as being continuously programmed by chirped reference pulses. The frequency stability of the laser was a crucial element for this experimental demonstration to work. The grating was programmed with low intensity pulses and remained in steady state for a time longer than the persistence time of the IBT.

Conclusion

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined in the appended claims and their equivalents.

What is claimed is:

1. An electromagnetic wave coherent transient device comprising:

a medium having an inhomogeneously broadened transition absorption spectrum and a relaxation time during which modifications to the inhomogeneously broadened transition absorption spectrum substantially decay away;

a plurality of programming paths impinging on the medium from a plurality of corresponding programming path directions;

a processing path impinging on the medium from a processing direction; and an output path emanating from the medium in an output direction, wherein the output direction, the processing direction and each direction of the plurality of corresponding programming path directions are phase matched so the output direction is different from the processing direction and different from each direction of the plurality of corresponding programming path directions.

2. The device of claim 1, further comprising a programming source of a plurality of corresponding modulated programming pulses which follow the plurality of programming paths to form a modified transition absorption spectrum in the medium.

3. The device of claim 2, wherein the programming source is configured to emit a first plurality of corresponding modulated programming pulses which follow the plurality of programming paths and a second plurality of corresponding modulated programming pulses after the first plurality of corresponding modulated programming pulses by a programming time interval shorter than the relaxation time.

4. The device of claim 3, wherein the second plurality of corresponding modulated programming pulses are substantially identical to the first plurality of corresponding modulated programming pulses and the second plurality of corresponding modulated programming pulses have sufficient amplitudes to maintain the modified transition absorption spectrum at a desired steady state.

5. The device of claim 3, wherein the second plurality of corresponding modulated programming pulses are substantially different from the first plurality of corresponding modulated programming pulses to reprogram the medium for a different modified transition absorption spectrum.

6. The device of claim 3, wherein:

the first plurality of corresponding modulated programming pulses have quick-start amplitudes, spatial structure and temporal form sufficient to change the modified transition absorption spectrum from an initial state toward a desired steady state;

the second plurality of corresponding modulated programming pulses have substantially reduced amplitudes sufficient to maintain the modified transition absorption spectrum at the desired steady state.

7. The device of claim 3, wherein:

the first plurality of corresponding modulated programming pulses have quick-start amplitudes, spatial structure and temporal form sufficient to change the inhomogeneously broadened transition absorption spectrum from a ground state toward a desired steady state; and the second plurality of corresponding modulated programming pulses have substantially reduced amplitudes sufficient to maintain the modified transition absorption spectrum at the desired steady state.

8. The device of claim 2 further comprising a processing source of a processing waveform having a processing start time and processing duration, which processing waveform travels along the processing path and overlaps in time the plurality of modulated programming pulses.

9. The device of claim 8 wherein an output waveform travels along the output path in response to the processing waveform.

10. The device of claim 9, wherein the processing waveform and each programming pulse of the plurality of corresponding modulated programming pulses has substantially an identical carrier frequency.

11. The device of claim 2, wherein each programming pulse of the particular plurality of corresponding modulated programming pulses has substantially an identical carrier frequency.

12. The device of claim 2, wherein the modified transition absorption spectrum has a spatial-spectral structure formed in response to an interference among the plurality of corresponding modulated programming pulses.

13. The device of claim 2, wherein:

the medium has an additional transition not included in the inhomogeneously broadened transition absorption spectrum; and at least one of the plurality of corresponding modulated programming pulses pumps the medium at the additional transition to affect population levels in the inhomogeneously broadened transition absorption spectrum.

14. The device of claim 1, wherein the electromagnetic wave is an optical wave.

15. An electromagnetic wave coherent transient device comprising:

a medium having an inhomogeneously broadened transition absorption spectrum and a relaxation time during which modifications to the inhomogeneously broadened transition absorption spectrum substantially decay away;

a programming source of a plurality of modulated programming pulses to form a modified transition absorption spectrum in the medium; and a processing signal source;

wherein the processing signal source is configured to send a processing signal onto a certain location in the medium during a processing time interval, and the programming source is configured to send the plurality of modulated programming pulses onto a location that at least partially overlaps the certain location during a programming signal time that overlaps in time the processing time interval.

16. The device of claim 15, wherein the modified transition absorption spectrum has a spatial-spectral structure formed in response to an interference among the plurality of modulated programming pulses.

17. The device of claim 16, wherein a first programming pulse of the plurality of programming pulses is spatially structured.

18. The device of claim 17, wherein the first programming pulse varies with time.

19. The device of claim 16, wherein the processing signal is spatially structured.

20. The device of claim 19, wherein the processing signal varies with time.

21. The device of claim 16, wherein the programming source is further configured to repeat the plurality of modulated programming pulses at a repetition interval less than the relaxation time to maintain a substantially constant spatial and spectral structure of the modified transition absorption spectrum.

22. The device of claim 16, further comprising:
a plurality of outgoing programming paths followed by the plurality of modulated programming pulses; after the plurality of modulated programming pulses impinge on the certain location in the medium
an outgoing processing path followed by the processing signal after the processing signal impinges on a location that at least partially overlaps the certain location in the medium; and
an output path associated with an output signal formed in response to the processing signal impinging on the certain location in the medium,
wherein,
the output path is spatially distinct from the outgoing processing path.

23. The device of claim 22, wherein the processing signal and the plurality of modulated programming pulses are phase matched to yield an output path spatially distinct from the plurality of outgoing programming paths.

24. The device of claim 22, wherein the output path spatially overlaps a particular outgoing programming path of the plurality of outgoing programming paths.

25. The device of claim 24, wherein the output signal is invalid while the output signal overlaps in time a particular programming pulse of the plurality of modulated programming pulses, which particular programming pulse is associated with the particular outgoing programming path.

26. The device of claim 15, wherein the programming source is configured to:
emit a first plurality of modulated programming pulses; and
emit a second plurality of modulated programming pulses after the first plurality of modulated programming pulses by a programming time interval shorter than the relaxation time.

27. The device of claim 26, wherein the second plurality of modulated programming pulses are substantially identical to the first plurality of corresponding modulated programming pulses.

28. The device of claim 27, wherein the second plurality of modulated programming pulses have sufficient amplitudes to maintain the modified transition absorption spectrum at a desired steady state.

29. The device of claim 26, wherein:
the first plurality of corresponding modulated programming pulses have quick-start amplitudes sufficient to change the inhomogeneously broadened transition absorption spectrum from a ground state toward a desired steady state; and
the second plurality of corresponding modulated programming pulses have substantially reduced amplitudes sufficient to maintain the modified transition absorption spectrum at the desired steady state.

30. The device of claim 26, wherein:
the first plurality of corresponding modulated programming pulses have quick-start amplitudes, spatial structure and temporal form sufficient to change the modified transition absorption spectrum from an initial state toward a desired steady state;

the second plurality of modulated programming pulses have substantially reduced amplitudes sufficient to maintain the modified transition absorption spectrum at the desired steady state.

31. The device of claim 26, wherein the second plurality of modulated programming pulses are substantially different from the first plurality of modulated programming pulses to reprogram the medium for a different modified transition absorption spectrum.

32. The device of claim 15, wherein the programming signal time is no longer than a coherence time of the inhomogeneously broadened transition absorption spectrum.

33. The device of claim 15, wherein each programming pulse of the plurality of modulated programming pulses has substantially an identical carrier frequency.

34. The device of claim 15, wherein the processing waveform and each programming pulse of the plurality of modulated programming pulses has substantially an identical carrier frequency.

35. The device of claim 15, wherein the electromagentic wave is an optical wave.

36. The device of claim 15, wherein:
the medium has an additional transition not included in the inhomogeneously broadened transition absorption spectrum; and
at least one of the plurality of modulated programming pulses pumps the medium at the additional transition to affect population levels in the inhomogeneously broadened transition absorption spectrum.

37. An optical coherent transient device comprising:
one or more lasers emitting optical radiation at a carrier frequency to form a processing waveform on a processing path and a plurality of programming pulses on a plurality of corresponding programming paths; and
a medium having an inhomogeneously broadened transition absorption spectrum and a relaxation time during which modifications to the inhomogeneously broadened transition absorption spectrum substantially decay away,
wherein
the processing signal impinges onto a certain location in the medium during a processing time interval, and a programming signal of the plurality of programming pulses impinges onto a location that at least partially overlaps the certain location during a programming signal time that overlaps in time the processing time interval to form a modified transition absorption spectrum.

38. A method of designing an electromagnetic wave coherent transient device comprising:
providing a medium having an inhomogeneously broadened transition absorption spectrum and a relaxation time during which modifications to the inhomogeneously broadened transition absorption spectrum substantially decay away;
providing a plurality of programming paths impinging on the medium from a plurality of corresponding programming path directions to form a modified transition absorption spectrum;
providing a processing path impinging on the medium from a processing direction;
providing an output path emanating from the medium in an output direction, and
phase matching the output direction, the processing direction and each direction of the plurality of corresponding programming path directions so the output direction is different from the processing direction and different from each direction of the plurality of corresponding programming path directions.

39. A method of designing an electromagnetic wave coherent transient device comprising:

providing a medium having an inhomogeneously broadened transition absorption spectrum and a relaxation time during which modifications to the inhomogeneously broadened transition absorption spectrum substantially decay away;

providing a programming signal source of a plurality of modulated programming pulses to form a modified transition absorption spectrum in the medium; and providing a processing signal source;

wherein the processing signal source is configured to send a processing signal onto a certain location in the medium during a processing time interval, and the programming source is configured to send the plurality of modulated programming pulses onto a location that at least partially overlaps the certain location during a programming signal time that overlaps in time the processing time interval.

40. A method of fabricating an electromagnetic wave coherent transient device comprising:

providing a medium having an inhomogeneously broadened transition absorption spectrum and a relaxation time during which modifications to the inhomogeneously broadened transition absorption spectrum substantially decay away;

providing a plurality of programming paths impinging on the medium from a plurality of corresponding programming path directions to form a modified transition absorption spectrum;

providing a processing path impinging on the medium from a processing direction; and providing an output path emanating from the medium in an output direction, wherein the output direction, the processing direction and each direction of the plurality of corresponding programming path directions are phase matched so the output direction is different from the processing direction and different from each direction of the plurality of corresponding programming path directions.

41. A method of fabricating an electromagnetic wave coherent transient device comprising:

providing a medium having an inhomogeneously broadened transition absorption spectrum and a relaxation time during which modifications to the inhomogeneously broadened transition absorption spectrum substantially decay away;

providing a programming signal source of a plurality of modulated programming pulses to form a modified transition absorption spectrum in the medium; and providing a processing signal source;

wherein the processing signal source is configured to send a processing signal onto a certain location in the medium during a processing time interval; and the programming signal source is configured to send a programming signal onto a location that at least partially overlaps the certain location during a programming signal time that overlaps in time the processing time interval.

42. A method of using a coherent electromagnetic wave transient device, the device comprising a medium having an inhomogeneously broadened transition absorption spectrum and a relaxation time during which modifications to the inhomogeneously broadened transition absorption spectrum substantially decay away, a plurality of programming paths impinging on the medium from a plurality of corresponding programming path directions, a processing path impinging on the medium from a processing direction, and an output path emanating from the medium in an output direction, the method comprising:

sending a plurality of programming pulses along the plurality of programming paths during a programming signal duration to form a modified transition absorption spectrum in the medium;

sending a processing signal of arbitrary duration along the processing path that overlaps in time at least one programming pulse of the plurality of programming pulses; and receiving an output signal of arbitrary duration along the output path in response to the processing signal.

43. The method of claim 42, wherein the modified transition absorption spectrum has a spatial-spectral structure formed in response to an interference among the plurality of programming pulses.

44. The method of claim 43, wherein a first programming pulse of the plurality of programming pulses is spatially structured.

45. The method of claim 44, wherein the first programming pulse varies with time.

46. The method of claim 43, wherein the processing signal is spatially structured.

47. The method of claim 46, wherein the processing signal varies with time.

48. The method of claim 43, said sending a plurality of programming pulses further comprising repeating the plurality of programming pulses at a repetition interval less than the relaxation time to maintain a substantially constant spatial and spectral structure of the modified transition absorption spectrum.

49. The method of claim 43, wherein the output path is spatially distinct from the processing path.

50. The method of claim 49, wherein the processing signal and the plurality of programming pulses are phase matched to yield an output path spatially distinct from the plurality of outgoing programming paths.

51. The method of claim 49, wherein the output path spatially overlaps a particular outgoing programming path of the plurality of programming paths.

52. The method of claim 51, further comprising ignoring the output signal while the output signal overlaps in time a particular programming pulse of the plurality of programming pulses, which particular programming pulse is associated with the particular outgoing programming path.

53. The method of claim 43, wherein the output signal is a true-time-delay of the processing signal.

54. The method of claim 53, wherein the plurality of programming pulses include two brief programming pulses separated by a separation time for producing an output delay time substantially equal to the separation time.

55. The method of claim 53, wherein the plurality of programming pulses include two frequency chirped programming pulses separated by a separation time for producing an output delay time substantially equal to the separation time.

56. The method of claim 53, wherein the plurality of programming pulses include any two pulses that autocorrelate well.

57. The method of claim 53, wherein the plurality of programming pulses include three or more pulses separated in time.

58. The method of claim 43, wherein the plurality of programming pulses store information for use as a memory.

59. The method of claim 58, wherein:
the plurality of programming pulses include a brief pulse and a temporally structured pulse; and
the processing pulse includes a brief pulse to substantially reproduce the temporally structured pulse in the output signal.

60. The method of claim 58, wherein:
the plurality of programming pulses include a frequency chirped pulse and a temporally structured pulse; and
the processing pulse includes a frequency chirped pulse that is substantially the same as the frequency chirped programming pulse to substantially reproduce the temporally structured pulse in the output signal.

61. The method of claim 58, wherein:
the plurality of programming pulses include a first pulse and a temporally structured pulse; and
the processing pulse includes a second pulse which correlates well with the first pulse to substantially reproduce the temporally structured pulse in the output signal.

62. The method of claim 58, wherein the plurality of programming pulses include three or more pulses separated in time.

63. The method of claim 58, wherein the plurality of programming pulses includes a swept carrier.

64. The method of claim 43, wherein the output signal is a convolution of the processing signal and a programming pulse of the plurality of programming pulses.

65. The method of claim 63, wherein:
the plurality of programming pulses include a brief pulse and a first temporally structured pulse;
the brief pulse precedes the first temporally structured pulse; and
the processing pulse is a second temporally structured pulse to substantially produce a convolution of the first temporally structured pulse with the second temporally structured pulse.

66. The method of claim 64, wherein the plurality of programming pulses include three or more pulses separated in time.

67. The method of claim 66, wherein:
the plurality of programming pulses include a first frequency chirped pulse, a second frequency chirped pulse, and a first temporally structured pulse;
the first and second frequency chirped pulses precede the first temporally structured pulse;
the first frequency chirped pulse precedes the second frequency chirped pulse;
a chirp rate of the first frequency chirped pulse is one half of a chirp rate of the second frequency chirped pulse; and
the processing pulse is a second temporally structured pulse to substantially produce a convolution of the first temporally structured pulse with the second temporally structured pulse.

68. The method of claim 43, wherein the output signal is related to a correlation between the processing signal and a programming pulse of the plurality of programming pulses.

69. The method of claim 68, wherein
the plurality of programming pulses include a brief pulse and a first temporally structured pulse;

the first temporally structured pulse precedes the brief pulse; and
the processing pulse is a second temporally structured pulse to substantially produce a correlation between the first and second temporally structured pulses in the output signal.

70. The method of claim 68, wherein the plurality of programming pulses include three or more pulses separated in time.

71. The method of claim 70, wherein:
the plurality of programming pulses include a first frequency chirped pulse, a second frequency chirped pulse and a first temporally structured pulse;
the first temporally structured pulse precedes the first and second frequency chirped pulses;
the first frequency chirped pulse precedes the second frequency chirped pulse, and
a chirp rate of the first frequency chirped pulse is twice a chirp rate of the second frequency chirped pulse, and
the processing pulse is a second temporally structured pulse to substantially produce a correlation between the first temporally structured pulse and the second temporally structured pulse in the output signal.

72. The method of claim 43, wherein the plurality of programming pulses cause the device to act as an angular multiplexer.

73. The method of claim 43, wherein the plurality of programming pulses cause the device to act as an angular demultiplexer.

74. The method of claim 43, wherein the plurality of programming pulses cause the device to act as a spatial-temporal image processor.

75. The method of claim 43, wherein the plurality of programming pulses cause the device to act as a signal router.

76. The method of claim 43, wherein the plurality of programming pulses cause the device to act as a spectrum analyzer.

77. The method of claim 42, said sending a plurality of programming pulses further comprising:
sending a first plurality of programming pulses along the plurality of programming paths; and
sending a second plurality of programming pulses along the plurality of programming paths after the first plurality of programming pulses by a programming time interval shorter than the relaxation time.

78. The method of claim 77, wherein the second plurality of programming pulses are substantially identical to the first plurality of programming pulses.

79. The method of claim 78, wherein the second plurality of programming pulses have sufficient amplitudes to maintain the modified transition absorption spectrum at a desired steady state.

80. The method of claim 77, wherein:
the first plurality of programming pulses have quick-start amplitudes sufficient to change the inhomogeneously broadened transition absorption spectrum from a ground state toward a desired steady state; and
the second plurality of corresponding modulated programming pulses have substantially reduced amplitudes sufficient to maintain the modified transition absorption spectrum at the desired steady state.

81. The method of claim 77, wherein:
the first plurality of programming pulses have quick-start amplitudes, spatial structure and temporal form sufficient to change the modified transition absorption spectrum from an initial state toward a desired steady state;

the second plurality of programming pulses have substantially reduced amplitudes sufficient to maintain the modified transition absorption spectrum at the desired steady state.

82. The method of claim 77, wherein the second plurality of programming pulses are substantially different from the first plurality of programming pulses to reprogram the medium for a different modified transition absorption spectrum.

83. The method of claim 42, wherein the programming signal duration is no longer than a coherence time of the inhomogeneously broadened transition absorption spectrum.

84. The method of claim 42, wherein each programming pulse of the plurality of programming pulses has substantially an identical carrier frequency.

85. The method of claim 42, wherein the processing waveform and each programming pulse of the plurality of programming pulses has substantially an identical carrier frequency.

86. The method of claim 42, wherein the electromagentic wave is an optical wave.

87. The method of claim 42, wherein:

the medium has an additional transition not included in the inhomogeneously broadened transition absorption spectrum; and at least one of the plurality of programming pulses pumps the medium at the additional transition to affect population levels in the inhomogeneously broadened transition absorption spectrum.

88. An optical coherent transient device comprising:

one or more lasers emitting electromagnetic radiation at a carrier frequency to form a processing waveform on a processing path and a plurality of programming pulses on a plurality of corresponding programming paths; and a medium having an inhomogeneously broadened transition absorption spectrum and a relaxation time during which modifications to the inhomogeneously broadened transition absorption spectrum substantially decay away, wherein the plurality of corresponding programming paths impinge on the medium from a plurality of corresponding programming path directions, the processing optical path impinges on the medium from a processing direction, an output optical path emanates from the medium in an output direction, and the output direction, the processing direction and each direction of the plurality of corresponding programming path directions are phase matched so the output direction is different from the processing direction and different from each direction of the plurality of corresponding programming path directions.

* * * * *

UNITED STATES PATENT AND TRADEMARK OFFICE
CERTIFICATE OF CORRECTION

PATENT NO. : 6,680,860 B1
DATED : January 20, 2004
INVENTOR(S) : Merkel et al.

It is certified that error appears in the above-identified patent and that said Letters Patent is hereby corrected as shown below:

<u>Column 1,</u>
Line 7, please insert, after the first paragraph and before the "Background" section,
-- GOVERNMENT SUPPORT
This invention was made with government support under two grants: (1) grant number N00014-97-1-1006 awarded by the U.S. Department of the Navy, Office of Naval Research, and (2) grant number "F49620-98-1-0283 awarded by the United States Air Force, Air Force Office of Scientific Research (USAF/AFOSR). The government has certain rights in the invention. --

Signed and Sealed this

Twelfth Day of October, 2004

JON W. DUDAS
*Director of the United States Patent and Trademark Office*